United States Patent
Okanuma et al.

(10) Patent No.: US 6,518,390 B2
(45) Date of Patent: Feb. 11, 2003

(54) PRECURSOR OF A HEAT RESISTANT RESIN, HEAT RESISTANT RESIN, INSULATING FILM AND SEMICONDUCTOR DEVICE

(75) Inventors: Masako Okanuma, Fujieda (JP); Tatsuhiro Yoshida, Yokohama (JP); Hidenori Saito, Yokohama (JP); Nobuhiro Higashida, Kawasaki (JP); Masanori Fujimoto, Yokohama (JP); Tadahiro Ishikawa, Yokohama (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 09/818,595

(22) Filed: Mar. 28, 2001

(65) Prior Publication Data

US 2002/0013443 A1 Jan. 31, 2002

(30) Foreign Application Priority Data

Mar. 29, 2000 (JP) .................... 2000-092260
Jun. 15, 2000 (JP) .................... 2000-180506
Jun. 28, 2000 (JP) .................... 2000-195184
Sep. 21, 2000 (JP) .................... 2000-286525
Dec. 28, 2000 (JP) .................... 2000-401349

(51) Int. Cl.$^7$ ............................. C08G 63/02
(52) U.S. Cl. ............ 528/176; 528/182; 528/190; 528/192; 528/201; 528/205; 528/272; 528/288; 528/308.6; 528/422; 528/425
(58) Field of Search .................... 528/176, 182, 528/190, 192, 201, 205, 272, 288, 308.6, 422, 425

(56) References Cited

U.S. PATENT DOCUMENTS 3,658,938 A * 4/1972 Kwiatkowski et al.
3,988,374 A * 10/1976 Brode et al. ............ 260/571
4,574,144 A * 3/1986 Yates et al. ............ 525/435
4,628,079 A * 12/1986 Zecher et al. ............ 528/49
5,216,117 A * 6/1993 Sheppard et al. ......... 528/332

FOREIGN PATENT DOCUMENTS

| EP | 0305882 | * | 8/1889 |
| JP | 1-115929 | | 5/1989 |
| JP | 2001-226599 | | 8/2001 |

OTHER PUBLICATIONS

Notice Informing Applicant of Communication of International Application to Designated Offices, issued in PCT/JP01/08209, dated Mar. 28, 2002 (Form PCT/IB/308).
Information Concerning Elected Offices Notified of Their Election, issued in PCT/JP01/08209, dated Mar. 28, 2002 (Form PCT/IB/332).
Cover sheet, WO 02/24785 published Mar. 28, 2002, showing English–language Abstract.
English–language copy of International Search Report, issued in PCT/JP01/08209, mailed Nov. 13, 2001 (Form PCT/ISA/210).

* cited by examiner

Primary Examiner—Duc Truong
(74) Attorney, Agent, or Firm—Smith, Gambrell & Russell, LLP

(57) ABSTRACT

A precursor of a polybenzoxazole resin which comprises a crosslinking group in a molecule and has a specific structure, a polybenzoxazole resin obtained from the precursor by the condensation reaction and the crosslinking reaction, an insulating film comprising the polybenzoxazole resin and a semiconductor device comprising an insulating interlayer film in multi-layer wiring or a film for protecting surfaces which comprises the above insulating film.

The precursor exhibits excellent processability due to excellent solubility in solvents and, after the ring closure, excellent heat stability in applications. The resin exhibits excellent electric, physical and mechanical properties and is advantageously used for insulating interlayer films of semiconductor devices and the like applications.

8 Claims, No Drawings

PRECURSOR OF A HEAT RESISTANT RESIN, HEAT RESISTANT RESIN, INSULATING FILM AND SEMICONDUCTOR DEVICE

BACKGROUND OF THE INVENTION

1. Field of the Invention

The present invention relates to a precursor of a heat resistant resin, a heat resistant resin, an insulating film and a semiconductor device. More particularly, the present invention relates to a precursor providing a polybenzoxazole resin which exhibits excellent electric, mechanical and physical properties, in particular, excellent properties under heating, and is advantageously used for insulating interlayer films and films for protecting surfaces in semiconductors, insulating interlayer films of multi-layer circuits, cover coats of flexible copper clad laminates, solder resist films and liquid crystal-aligning films, a polybenzoxazole resin which is obtained from the above precursor and has the above characteristics, an insulating film comprising the polybenzoxazole resin and a semiconductor device comprising the insulating film.

2. Description of Related Art

As the insulating interlayer films, films of oxides (films of SiOx) prepared in accordance with the chemical vapor deposition process (the CVD process) are mainly used at present. However, inorganic insulating films such as films of oxides have a great permittivity. To achieve a high speed and a high performance of semiconductors, an insulating film having a low permittivity is desired and films of organic materials have been examined as the candidates. As the organic material used for semiconductors, heat resistant resins having excellent electric, mechanical and physical properties are proposed.

For example, application of polybenzoxazole resins as the above heat resistant resin has been attempted. To obtain a polybenzoxazole resin, in general, a precursor of the polybenzoxazole resin is prepared from a bisaminophenol compound and a dicarboxylic acid compound. An article such as a film is prepared by using the precursor and the precursor formed into the article is then converted into a polybenzoxazole resin. Examples of the polybenzoxazole resin include polybenzoxazole resins synthesized from 4,4'-diamino-3,3'-dihydroxybiphenyl and terephthalic acid and polybenzoxazole resins synthesized from 4,4'-diamino-3,3'-dihydroxybiphenyl and 4,4'-biphenyldicarboxylic acid.

As described above, heat resistance can be easily improved by providing a rigid skeleton structure to a resin. However, this causes a decrease in the solubility of a precursor of the resin into organic solvents and working of the resin such as preparation of a film in accordance with a coating process becomes very difficult. On the other hand, for example, a polybenzoxazole resin prepared from 2,2-bis(3-amino-4-hydroxyphenyl)-hexafluoropropane and isophthalic acid can be worked into various shapes since the precursor is soluble in organic solvents. However, when the above precursor is converted into a polybenzoxazole resin, heat resistance of the obtained resin tends to be inferior to the former polybenzoxazole resins.

Since the above heat resistant resins are examined as materials to replace inorganic compounds in applications such as insulating interlayer films in semiconductors, the improvement in the heat resistance of the heat resistant resins is increasingly required. It is necessary that heat resistance be further improved while the resin is kept soluble in organic solvents so that excellent processability is maintained.

SUMMARY OF THE INVENTION

The present invention has objects of providing a precursor of a polybenzoxazole resin which exhibits excellent processability due to excellent solubility in solvents and, after ring closure, excellent heat stability in applications and provides a resin which exhibits excellent electric, physical and mechanical properties and is advantageously used for insulating interlayer films of semiconductor devices; a heat resistant resin which is obtained from the above precursor and has the above characteristics; an insulating film comprising the polybenzoxazole resin; and a semiconductor device comprising the insulating film.

As the result of extensive studies by the present inventors to achieve the above objects, it was found that a precursor of a polybenzoxazole resin having a specific structure which is obtained by introducing a three-dimensionally crosslinking functional group into the structure of the main chain maintains the solubility in organic solvents and can be converted into a resin having high heat resistance by heating due to a three-dimensional structure formed by a combination of a conventional condensation reaction (the ring closure reaction with elimination of water) and the crosslinking reaction. The present invention has been completed based on the knowledge.

The present invention provides:

(1) A precursor of a polybenzoxazole resin which comprises a crosslinking group in a molecule;

(2) A precursor of a polybenzoxazole resin described in (1), which comprises a structure represented by general formula [1]:

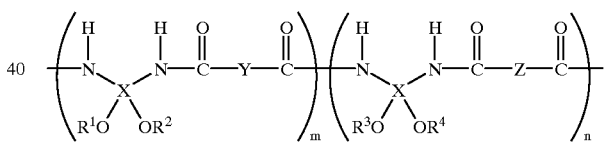

[1]

wherein $R^1$ to $R^4$ each independently represent hydrogen atom or a monovalent organic group, X represents a tetravalent group selected from groups represented by following formulae (A), two groups represented by X may be the same with or different from each other, Y represents at least one divalent group selected from groups represented by following formulae (B), (C), (D) and (E), Z represents a divalent group selected from groups represented by following formulae (F), m and n each represent an integer satisfying relations of m>0, n≧0, 2≦m+n≦1,000 and 0.05≦m/(m+n) ≦1 and arrangement of repeating units may be a block arrangement or a random arrangement;

Formulae (A)

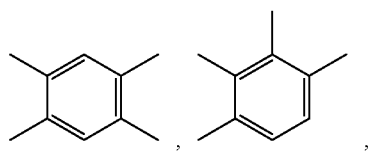

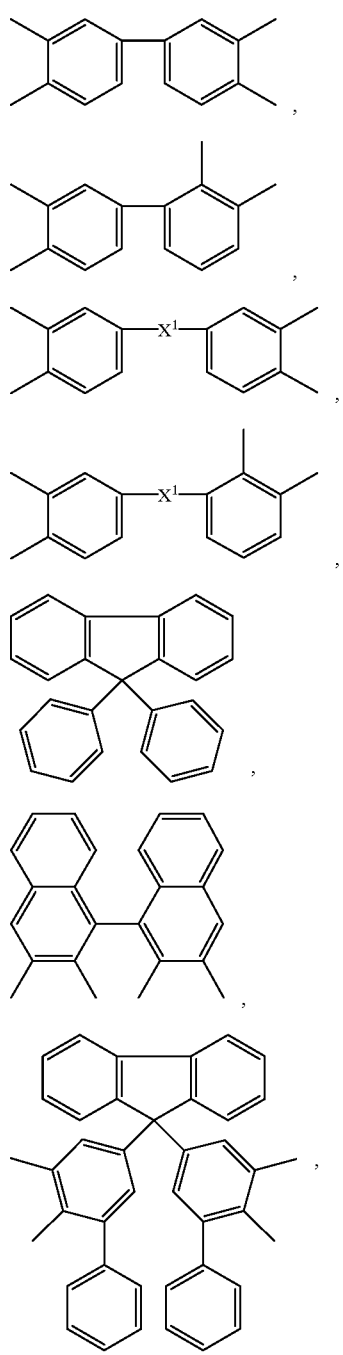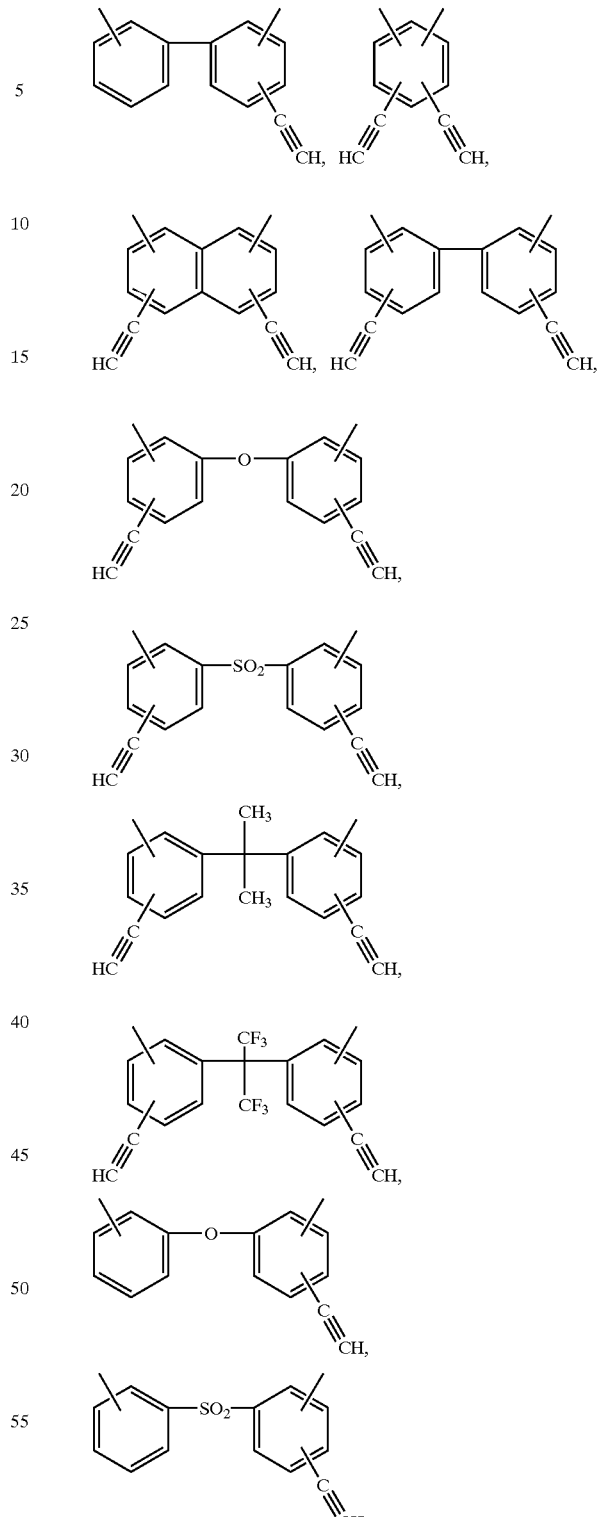
Formulae (B)-1
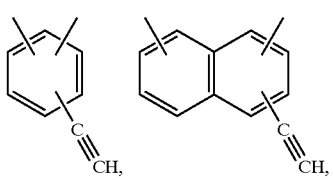

-continued
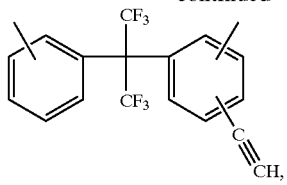
Formulae (B)-2
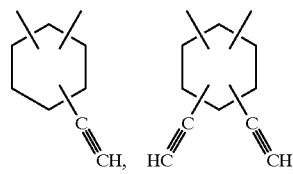
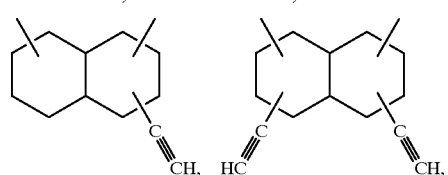
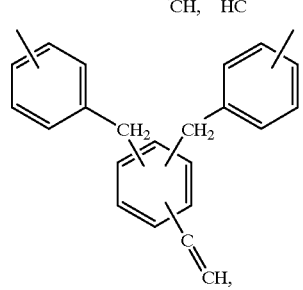
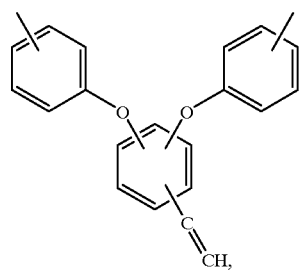
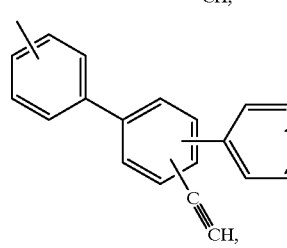
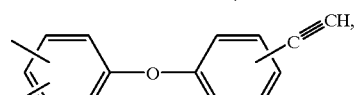
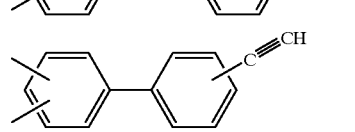
Formulae (C)-1
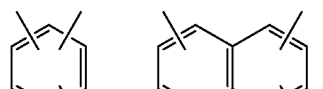
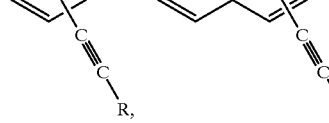
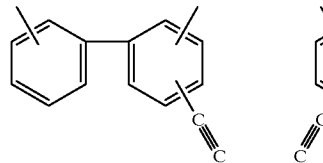
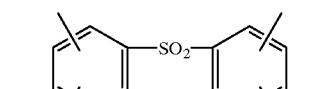
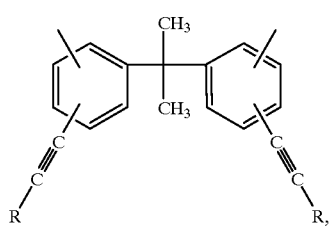

-continued
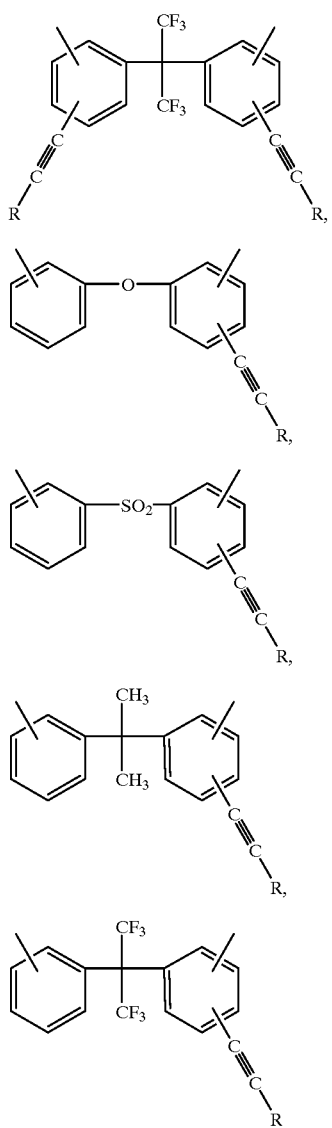
Formulae (C)-2
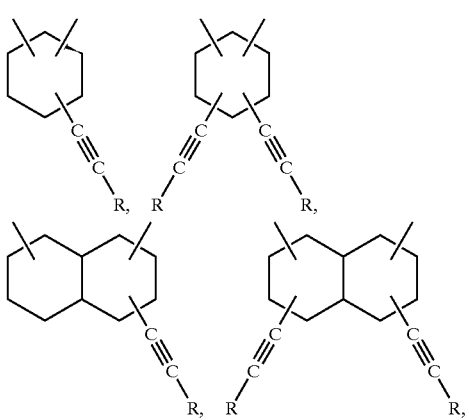
-continued
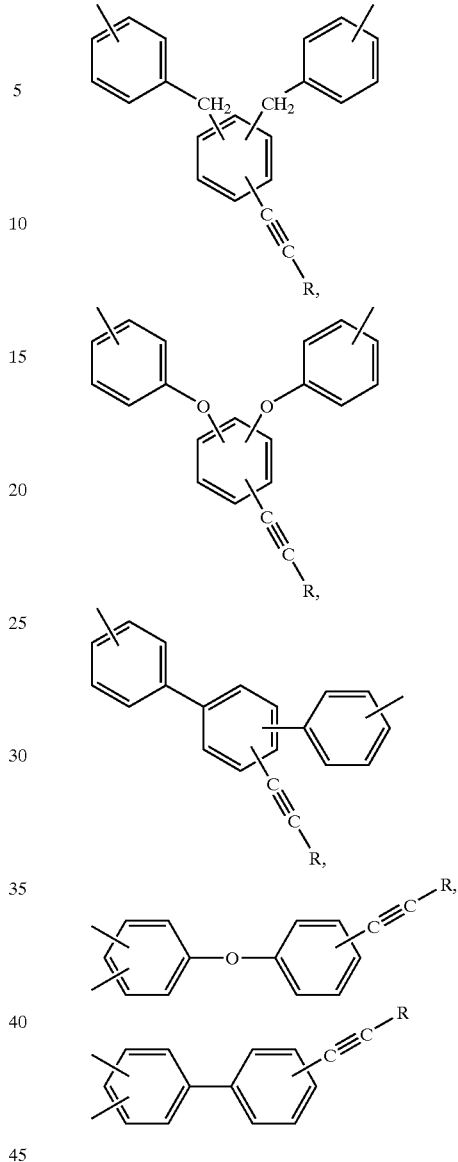
Formulae (D)
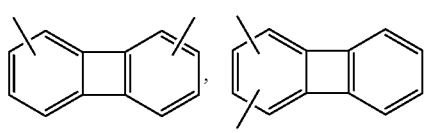
Formula (E)
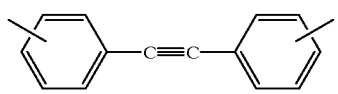

Formulae (F)
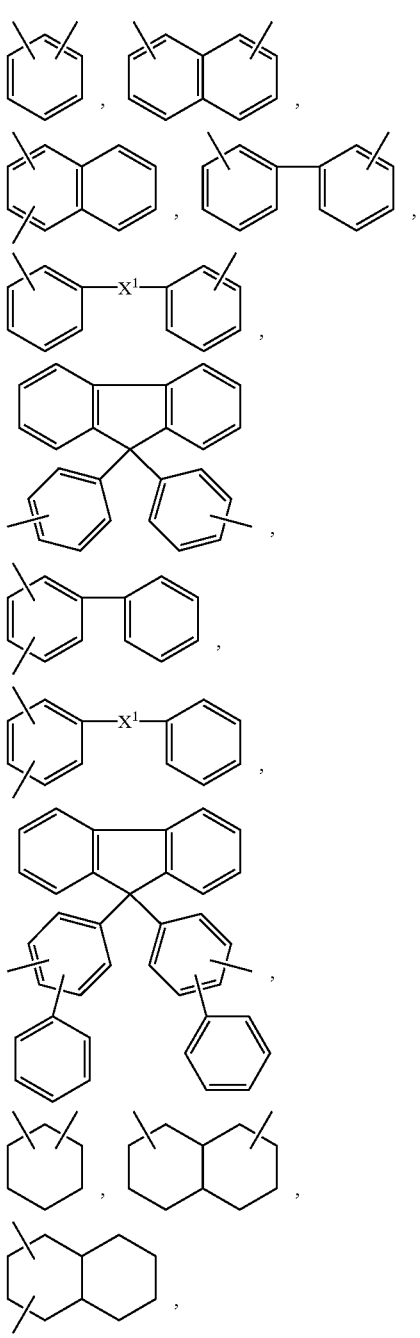
wherein $X^1$ in formulae (A) and (F) represents a divalent group selected from groups represented by following formulae (G):
Formula (G)
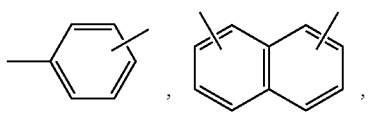
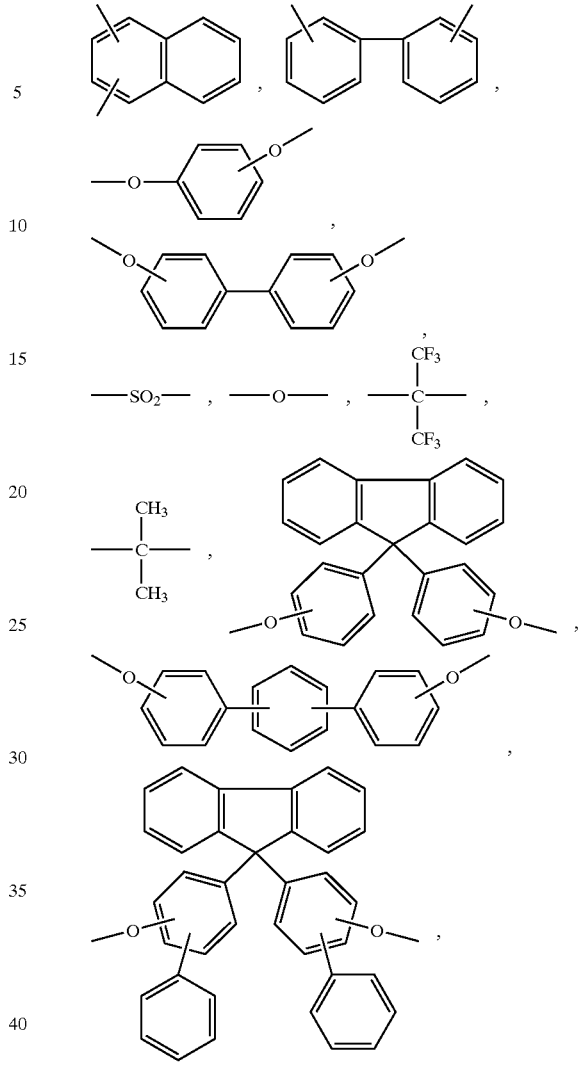
R in formulae (C) represents an alkyl group or a monovalent group selected from groups represented by formulae (H):
Formulae (H)
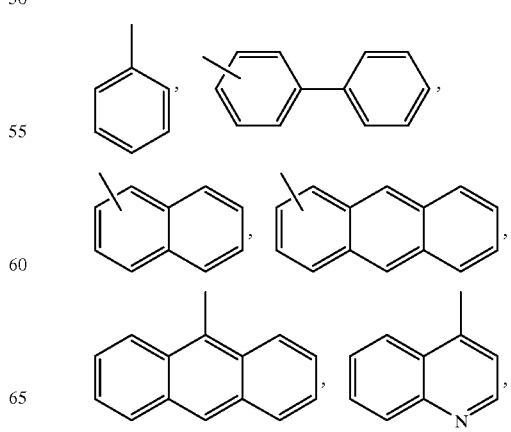

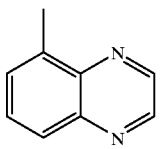

and hydrogen atoms on a benzene ring in groups represented by Formulae (A), (B), (C), (D), (E), (F) and (G) may be substituted with at least one atom or group selected from alkyl groups having 1 to 4 carbon atom, fluorine atom and trifluoromethyl group;

(3) A polybenzoxazole resin which is obtained from a precursor of a polybenzoxazole resin described in any of (1) and (2) by a condensation reaction and a crosslinking reaction;

(4) An insulating film which comprises a polybenzoxazole resin described in (3); and (5) A semiconductor device which comprises at least one film which is selected from insulating interlayer films in multi-layer wiring and films for protecting surfaces and comprises an in sulating film described in (4).

DESCRIPTION OF THE PREFERRED EMBODIMENTS

The precursor of a polybenzoxazole resin of the present invention comprises a crosslinking group in the molecule. Examples of the crosslinking group include substituent groups which can be three-dimensionally crosslinked such as ethynyl group, substituted ethynyl groups, internal acetylene group, biphenylene group, cyanato group, maleimide group, nadimide group and propargyl group. The precursor may have one or more crosslinking groups in the molecule.

As the precursor of a polybenzoxazole described above, compounds comprising the structure represented by the above general formula [1] are preferable.

The precursor of a polybenzoxazole resin comprising the structure represented by general formula [1] can be obtained in accordance with a conventional process such as the acid chloride process, the activated ester process and the condensation reaction in the presence of an agent for condensation with elimination of water such as polyphosphoric acid and dicyclohexylcarbodiimide using at least one compound selected from bisaminophenol compounds having a tetravalent group selected from the groups represented by formulae (A) and at least one dicarboxylic acid having a crosslinking group selected from the divalent groups represented by formulae (B), (C), (D) and (E). A combination of the above dicarboxylic acid and a dicarboxylic acid having a divalent group selected from the groups represented by formulae (F) may be used as the dicarboxylic acid. A highly heat resistant resin can also be obtained by forming an interpenetrating network from a combination of a polyamide comprising at least one skeleton structure represented by general formula [1], such as the ethynyl structure, the phenylethynyl structure, the alkylethynyl structures, the biphenylene structure and the internal acetylene structure, and a conventional polyamide without crosslinking groups, i.e., without the crosslinking reactivity. A polyamide which does not have the ethynyl skeleton structure, the phenylethynyl skeleton structure, the alkylethynyl skeleton structures, the biphenylene skeleton structure or the internal acetylene skeleton structure can be obtained in accordance with a process similar to the processes described above using at least one compound selected from bisaminophenol compounds having a tetravalent group selected from the groups represented by formulae (A) and at least one compound selected from dicarboxylic acids having a divalent group selected from the groups represented by formulae (F).

Examples of the bisaminophenol compound having a tetravalent group selected from the groups represented by formulae (A) include 2,4-diaminoresorcinol, 4,6-diaminoresorcinol, 2,2-bis(3-amino-4-hydroxy-phenyl)hexafluoropropane, 2,2-bis(4-amino-3-hydroxyphenyl)hexafluoro-propane, 2,2-bis(3-amino-4-hydroxyphenyl)propane, 2,2-bis(4-amino-3-hydroxyphenyl)propane, 3,3'-diamino-4,4'-dihydroxydiphenylsulfone, 4,4'-diamino-3,3'-dihydroxydiphenylsulfone, 3,3'-diamino-4,4'-dihydroxybiphenyl, 4,4'-diamino-3,3'-dihydroxybiphenyl, 9,9-bis(4-((4-amino-3-hydroxy)phenoxy)phenyl)fluorene, 9,9-bis(4-((3-amino-4-hydroxy)-phenoxy)phenyl)fluorene, 9,9-bis((4-amino-3-hydroxy)phenyl)fluorene, 9,9-bis((3-amino-4-hydroxy)phenyl)fluorene, 9,9-bis(4-((4-amino-3-hydroxy)-phenoxy)-3-phenylphenyl)fluorene, 9,9-bis(4-((3-amino-4-hydroxy)-phenoxy)-3-phenylphenyl)fluorene, 9,9-bis((2-amino-3-hydroxy-4-phenyl)-phenyl)fluorene, 9,9-bis((2-hydroxy-3-amino-4-phenyl)phenyl)fluorene, 3,3'-diamino-4,4'-dihydroxydiphenyl ether, 4,4'-diamino-3,3'-dihydroxydi-phenyl ether, 2,2-bis(3-amino-4-hydroxy-2-trifluoromethylphenyl)propane, 2,2-bis(4-amino-3-hydroxy-2-trifluoromethylphenyl)propane, 2,2-bis(3-amino-4-hydroxy-5-trifluoromethylphenyl)propane, 2,2-bis(4-amino-3-hydroxy-5-trifluoromethylphenyl)propane, 2,2-bis(3-amino-4-hydroxy-6-trifluoromethylphenyl)propane, 2,2-bis(4-amino-3-hydroxy-6-trifluoromethylphenyl)propane, 2,2-bis(3-amino-4-hydroxy-2-trifluoromethylphenyl)hexafluoropropane, 2,2-bis(4-amino-3-hydroxy-2-trifluoromethylphenyl)hexafluoropropane, 2,2-bis(3-amino-4-hydroxy-5-trifluoromethylphenyl)hexafluoropropane, 2,2-bis(4-amino-3-hydroxy-5-trifluoromethylphenyl)hexafluoropropane, 2,2-bis(3-amino-4-hydroxy-6-trifluoromethylphenyl)hexafluoropropane, 2,2-bis(4-amino-3-hydroxy-6-trifluoromethylphenyl)hexafluoropropane, 3,3'-diamino-4,4'-dihydroxy-2,2'-bis(trifluoromethyl)biphenyl, 4,4'-diamino-3,3'-dihydroxy-2,2'-bis(trifluoromethyl)biphenyl, 3,3'-diamino-4,4'-dihydroxy-5,5'-bis(trifluoromethyl)biphenyl, 4,4'-diamino-3,3'-dihydroxy-5,5'-bis(trifluoromethyl)biphenyl, 3,3'-diamino-4,4'-dihydroxy-6,6'-bis(trifluoromethyl)biphenyl and 4,4'-diamino-3,3'-dihydroxy-6,6'-bis(trifluoromethyl)biphenyl. The above compounds may be used singly or in combination of two or more.

Examples of the dicarboxylic acid having an ethynyl skeleton structure having a divalent group selected from the groups represented by formulae (B) include 3-ethynylphthalic acid, 4-ethynylphthalic acid, 2-ethynylisophthalic acid, 4-ethynylisophthalic acid, 5-ethynylisophthalic acid, 2-ethynylterephthalic acid, 3-ethynylterephthalic acid, 5-ethynylterephthalic acid, 2-ethynyl-1,5-naphthalenedicarboxylic acid, 3-ethynyl-1,5-naphthalenedicarboxylic acid, 4-ethynyl-1,5-naphthalenedicarboxylic acid, 1-ethynyl-2,6-naphthalenedicarboxylic acid, 3-ethynyl-2,6-naphthalenedicarboxylic acid, 4-ethynyl-2,6-naphthalenedicarboxylic acid, 2-ethynyl-1,6-naphthalenedicarboxylic acid, 3-ethynyl-1,6-naphthalenedicarboxylic acid, 4-ethynyl-1,6-naphthalenedicarboxylic acid, 5-ethynyl-1,6-naphthalenedicarboxylic acid, 7-ethynyl-1,6-naphthalenedicarboxylic acid, 8-ethynyl-1,6-naphthalenedicarboxylic acid, 3,3'-diethynyl-2,2'-biphenyldicarboxylic acid, 4,4'-diethynyl-2,2'-biphenyl-dicarboxylic acid, 5,5'-diethynyl-2,2'-biphenyldicarboxylic acid, 6,6'-diethynyl-2,2'- biphenyldicarboxylic acid, 2,2'-diethynyl-3,3'-biphenyldicarboxylic acid, 4,4'-diethynyl-3,3'-biphenyldicarboxylic acid, 5,5'-diethynyl-3,3'-biphenyldicarboxylic acid, 6,6'-diethynyl-3,3'-biphenyl-dicarboxylic acid, 2,2'-diethynyl-4,4'-biphenyldicarboxylic acid, 3,3'-diethynyl-4,4'-biphenyldicarboxylic acid, 2,2-bis(2-carboxy-3-ethynylphenyl)propane, 2,2-bis(2-carboxy-4-ethynylphenyl)propane, 2,2-bis(2-carboxy-5-ethynylphenyl)propane, 2,2-bis(2-carboxy-6-ethynylphenyl)propane, 2,2-bis(3-carboxy-2-ethynylphenyl)propane, 2,2-bis(3-carboxy-4-ethynylphenyl)propane, 2,2-bis(3-carboxy-5-ethynylphenyl)-propane, 2,2-bis(3-carboxy-6-ethynylphenyl)propane, 2,2-bis(4-carboxy-2-ethynylphenyl)propane, 2,2-bis(4-carboxy-3-ethynylphenyl)propane, 2,2-bis(2-carboxy-4-ethynylphenyl)hexafluoropropane, 2,2-bis(3-carboxy-5-ethynylphenyl)hexafluoropropane, 2,2-bis(4-carboxy-2-ethynylphenyl)-hexafluoropropane, 2,2-bis(4-carboxy-3-ethynylphenyl)hexafluoropropane, 4-ethynyl-1,3-dicarboxylcyclopropane, 5-ethynyl-2,2-dicarboxy-cyclopropane, structural isomers of 1,3-bis(4-carboxyphenoxy)-5-ethynylbenzene, structural isomers of 1,3-bis(4-carboxyphenyl)-5-ethynylbenzene, 5-(3-ethynylphenoxy)isophthalic acid, 5-(1-ethynylphenoxy) isophthalic acid, 5-(2-ethynylphenoxy)isophthalic acid, 2-(1-ethynylphenoxy)terephthalic acid, 2-(2-ethynylphenoxy)terephthalic acid, 2-(3-ethynylphenoxy) terephthalic acid, 5-(1-ethynylphenyl)-isophthalic acid, 5-(2-ethynylphenyl)isophthalic acid, 5-(3-ethynylphenyl)-isophthalic acid, 2-(1-ethynylphenyl)terephthalic acid, 2-(2-ethynylphenyl)terephthalic acid and 2-(3-ethynylphenyl) terephthalic acid. However the dicarboxylic acid is not limited to the compounds described as the examples. The above compound may be used singly or in combination of two or more. The above compounds may be used in combination with two or more bisaminophenyl compounds.

Examples of the substituent represented by R in the divalent groups represented by formulae (C) used in the present invention include alkyl groups and monovalent groups represented by formulae (H) such as phenyl group, biphenyl group, naphthyl group, anthryl group, quinolyl group and quinoxalyl group. Examples of the dicarboxylic acid having the phenylethynyl skeleton structure in which the substituent represented by R is phenyl group include 3-phenylethynylphthalic acid, 4-phenylethynylphthalic acid, 2-phenylethynylisophthalic acid, 4-phenylethynylisophthalic acid, 5-phenylethynylisophthalic acid, 2-phenylethynylterephthalic acid, 3-phenylethynylterephthalic acid, 2-phenylethynyl-1,5-naphthalenedicarboxylic acid, 3-phenylethynyl-1,5-naphthalenedicarboxylic acid, 4-phenylethynyl-1,5-naphthalene-dicarboxylic acid, 1-phenylethynyl-2,6-naphthalenedicarboxylic acid, 3-phenylethynyl-2,6-naphthalenedicarboxylic acid, 4-phenylethynyl-2,6-naphthalenedicarboxylic acid, 2-phenylethynyl-1,6-naphthalene-dicarboxylic acid, 3-phenylethynyl-1,6-naphthalenedicarboxylic acid, 3-phenylethynyl-1,6-naphthalenedicarboxylic acid, 4-phenylethynyl-1,6-naphthalenedicarboxylic acid, 5-phenylethynyl-1,6-naphthalene-dicarboxylic acid, 7-phenylethynyl-1,6-naphthalenedicarboxylic acid, 8-phenylethynyl-1,6-naphthalenedicarboxylic acid, 3,3'-diphenylethynyl-2,2'-biphenyldicarboxylic acid, 4,4'-diphenylethynyl-2,2'-biphenyl-dicarboxylic acid, 5,5'-diphenylethynyl-2,2'-biphenyldicarboxylic acid, 6,6'-diphenylethynyl-2,2'-biphenyldicarboxylic acid, 2,2'-diphenylethynyl-3,3'-biphenyldicarboxylic acid, 4,4'-diphenylethynyl-3,3'-biphenyldicarboxylic acid, 5,5'-diphenylethynyl-3,3'-biphenyldicarboxylic acid, 6,6'-diphenylethynyl-3,3'-biphenyldicarboxylic acid, 2,2'-diphenylethynyl-4,4'-biphenyldicarboxylic acid, 3,3'-diphenylethynyl-4,4'-biphenyldicarboxylic acid, 2,2-bis(2-carboxy-3-phenylethynylphenyl)propane, 2,2-bis(2-carboxy-4-phenylethynylphenyl)propane, 2,2-bis(2-carboxyl-5-phenylethynyl-phenyl)propane, 2,2-bis(2-carboxy-6-phenylethynylphenyl)propane, 2,2-bis(3-carboxy-2-phenylethynylphenyl)propane, 2,2-bis(3-carboxy-4-phenylethynylphenyl)propane, 2,2-bis(3-carboxy-5-phenylethynylphenyl)-propane, 2,2-bis(3-carboxy-6-phenylethynylphenyl)propane, 2,2-bis(4-carboxy-2-phenylethynylphenyl)propane, 2,2-bis(4-carboxy-3-phenylethynylphenyl)propane, 2,2-bis(2-carboxy-4-phenylethynylphenyl)-hexafluoropropane, 2,2-bis(3-carboxy-5-phenylethynylphenyl)hexafluoro-propane, 2,2-bis(4-carboxy-2-phenylethynylphenyl)hexafluoropropane, 2,2-bis(4-carboxy-2-phenylethynylphenyl) hexafluoropropane, 4-phenyl-ethynyl-1,3-dicarboxycyclopropane, 5-phenylethynyl-2,2-dicarboxy-cyclopropane, structural isomers of 1,3-bis(4-carboxyphenoxy)-5-phenylethynylbenzene, structural isomers of 1,3-bis(4-carboxyphenyl)-5-phenylethynylbenzene, 5-(1-phenylethynylphenoxy) isophthalic acid, 5-(2-phenylethynylphenoxy)isophthalic acid, 5-(3-phenylethynylphenoxy)-isophthalic acid, 2-(1-phenylethynylphenoxy)terephthalic acid, 2-(2-phenylethynylphenoxy)terephthalic acid, 2-(3-phenylethynylphenoxy)-terephthalic acid, 5-(1-phenylethynylphenyl)isophthalic acid, 5-(2-phenylethynylphenyl)isophthalic acid, 5-(3-phenylethynylphenyl)-isophthalic acid, 2-(1-phenylethynylphenyl)terephthalic acid, 2-(2-phenylethynylphenyl)terephthalic acid and 2-(3-phenylethynylphenyl)-terephthalic acid.

Examples of the dicarboxylic acid having the alkylethynyl skeleton structure in which the substituent represented by R is an alkyl group include 3-hexynylphthalic acid, 4-hexynylphthalic acid, 2-hexynyl-isophthalic acid, 4-hexynylisophthalic acid, 5-hexynylisophthalic acid, 2-hexynylterephthalic acid, 3-hexynylterephthalic acid, 2-hexynyl-1,5-naphthalenedicarboxylic acid, 3-hexynyl-1,5-naphthalenedicarboxylic acid, 4-hexynyl-1,5-naphthalenedicarboxylic acid, 1-hexynyl-2,6-naphthalene-dicarboxylic acid, 3-hexynyl-2,6-naphthalenedicarboxylic acid, 4-hexynyl-2,6-naphthalenedicarboxylic acid, 2-hexynyl-1,6-naphthalenedicarboxylic acid, 3-hexynyl-1,6-naphthalenedicarboxylic acid, 4-hexynyl-1,6-naphthalenedicarboxylic acid, 5-hexynyl-1,6-naphthalenedicarboxylic acid, 7-hexynyl-1,6-naphthalenedicarboxylic acid, 8-hexynyl-1,6-naphthalene-dicarboxylic acid, 3,3'-dihexynyl-2,2'-biphenyldicarboxylic acid, 4,4'-dihexynyl-2,2'-biphenyldicarboxylic acid, 5,5'-dihexynyl-2,2-biphenyl-dicarboxylic acid, 6,6'-dihexynyl-2,2'-biphenyldicarboxylic acid, 2,2'-dihexynyl-3,3'-biphenyldicarboxylic acid, 4,4'-dihexynyl-3,3'-biphenyl-dicarboxylic acid, 5,5'-dihexynyl-3,3'-biphenyldicarboxylic acid, 6,6'-dihexynyl-3,3'-biphenyldicarboxylic acid, 2,2'-dihexynyl-4,4'-biphenyl-dicarboxylic acid, 3,3'-dihexynyl-4,4'-biphenyldicarboxylic acid, 2,2-bis(2-carboxy-3-hexynylphenyl)propane, 2,2-bis(2-carboxy-4-hexynylphenyl)-propane, 2,2-bis(2-carboxy-5-hexynylphenyl)propane, 2,2-bis(2-carboxy-6-hexynylphenyl)propane, 2,2-bis(3-carboxy-2-hexynylphenyl)propane, 2,2-bis(3-carboxy-4- hexynylphenyl)propane, 2,2-bis(3-carboxy-5-hexynylphenyl)propane, 2,2-bis(3-carboxy-6-hexynylphenyl)propane, 2,2-bis(4-carboxy-2-hexynylphenyl)propane, 2,2-bis(4-carboxy-3-hexynylphenyl)-propane, 2,2-bis(2-carboxy-4-hexynylphenyl)hexafluoropropane, 2,2-bis(3-carboxy-5-hexynylphenyl)hexafluoropropane, 2,2-bis(4-carboxy-2-hexynyl-phenyl)hexafluoropropane, 4-hexynyl-1,3-dicarboxycyclopropane, 5-hexynyl-2,2-dicarboxycyclopropane, structural isomers of 1,3-bis(4-carboxyphenoxy)-5-hexynylbenzene, structural isomers of 1,3-bis(4-carboxyphenyl)-5-hexynylbenzene, 5-(3-hexynylphenoxy)isophthalic acid, 5-(1-hexynyl-phenoxy)isophthalic acid, 5-(2-hexynylphenoxy)isophthalic acid, 2-(1-hexynylphenoxy)terephthalic acid, 2-(2-hexynylphenoxy)terephthalic acid, 2-(3-hexynylphenoxy)terephthalic acid, 5-(1-hexynylphenyl)isophthalic acid, 5-(2-hexynylphenyl)isophthalic acid, 5-(3-hexynylphenyl)isophthalic acid, 2-(1-hexynylphenyl)terephthalic acid, 2-(2-hexynylphenyl)-terephthalic acid and 2-(3-hexynylphenyl)terephthalic acid. However, the dicarboxylic acid is not limited to the compounds described as the examples.

The above compounds may be used singly or in combination of two or more. The above compounds may be used in combination with two or more bisaminophenyl compounds.

Examples of the dicarboxylic acid having the biphenylene skeleton structure having the divalent group selected from the groups represented by formulae (D) include 1,2-biphenylenedicarboxylic acid, 1,3-biphenylenedicarboxylic acid, 1,4-biphenylenedicarboxylic acid, 1,5-biphenylenedicarboxylic acid, 1,6-biphenylenedicarboxylic acid, 1,7-biphenylenedicarboxylic acid, 1,8-biphenylenedicarboxylic acid, 2,3-biphenylenedicarboxylic acid, 2,6-biphenylenedicarboxylic acid and 2,7-biphenylenedicarboxylic acid. From the standpoint of the properties of the obtained coating film, 2,6-biphenylenedicarboxylic acid and 2,7-biphenylenedicarboxylic acid are preferable. The above compounds may be used singly or in combination of two or more.

Examples of the dicarboxylic acid having the internal acetylene skeleton structure having the divalent group represented by formula (E) include 4,4'-tolandicarboxylic acid, 3,4'-tolandicarboxylic acid, 3,3'-tolandicarboxylic acid, 2,4'-tolandicarboxylic acid, 2,3'-tolandicarboxylic acid and 2,2'-tolandicarboxylic acid. The above compounds may be used singly or in combination of two or more.

The above tolandicarboxylic acids can be obtained, for example, by preparing stilbene from a derivative of a benzoic acid ester and synthesizing the tolan skeleton structure from the obtained stilbene or by synthesis with introduction of the tolan skeleton structure using a derivative of a benzoic acid ester and a phenylethynyl derivative in accordance with the Heck reaction.

Examples of the dicarboxylic acid having a divalent group selected from the groups represented by formulae (F) include isophthalic acid, terephthalic acid, 4,4'-biphenyldicarboxylic acid, 3,4'-biphenyldicarboxylic acid, 3,3'-biphenyldicarboxylic acid, 1,4-naphthalenedicarboxylic acid, 2,3-naphthalenedicarboxylic acid, 2,6-naphthalenedicarboxylic acid, 4,4'-sulfonylbisbenzoic acid, 3,4'-sulfonylbisbenzoic acid, 3,3'-sulfonylbisbenzoic acid, 4,4'-oxybisbenzoic acid, 3,4'-oxybisbenzoic acid, 3,3'-oxybisbenzoic acid, 2,2-bis(4-carboxyphenyl)propane, 2,2-bis(3-carboxyphenyl)propane, 2,2-bis(4-carboxyphenyl)hexafluoropropane, 2,2-bis(3-carboxyphenyl)-hexafluoropropane, 2,2'-dimethyl-4,4'-biphenyldicarboxylic acid, 3,3'-dimethyl-4,4'-biphenyldicarboxylic acid, 2,2'-dimethyl-3,3'-biphenyl-dicarboxylic acid, 2,2'-bis(trifluoromethyl)-4,4'-biphenyldicarboxylic acid, 3,3'-bis(trifluoromethyl)-4,4'-biphenyldicarboxylic acid, 2,2'-bis(trifluoromethyl)-3,3'-biphenyldicarboxylic acid, 9,9-bis(4-(4-carboxy-phenoxy)phenyl)fluorene, 9,9-bis(4-(3-carboxyphenoxy)phenyl)fluorene, 4,4'-bis(4-carboxyphenoxy)biphenyl, 4,4'-bis(3-carboxyphenoxy)biphenyl, 3,4'-bis(4-carboxyphenoxy)biphenyl, 3,4'-bis(3-carboxyphenoxy)biphenyl, 3,3'-bis(4-carboxyphenoxy)biphenyl, 3,3'-bis(3-carboxyphenoxy)biphenyl, 4,4'-bis(4-carboxyphenoxy)-p-terphenyl, 4,4'-bis(4-carboxyphenoxy)-m-terphenyl, 3,4'-bis(4-carboxyphenoxy)-p-terphenyl, 3,3'-bis(4-carboxyphenoxy)-p-terphenyl, 3,4'-bis(4-carboxyphenoxy)-m-terphenyl, 3,4'-bis(4-carboxyphenoxy)-m-terphenyl, 4,4'-bis(3-carboxyphenoxy)-p-terphenyl, 4,4'-bis(3-carboxyphenoxy)-m-terphenyl, 3,4'-bis(3-carboxyphenoxy)-p-terphenyl, 3,3'-bis(3-carboxyphenoxy)-p-terphenyl, 3,4'-bis(3-carboxyphenoxy)-m-terphenyl, 3,3'-bis(3-carboxyphenoxy)-m-terphenyl, 3-fluoroisophthalic acid, 2-fluoroisophthalic acid, 2-fluoroterephthalic acid, 2,4,5,6-tetrafluoroisophthalic acid, 2,3,5,6-tetrafluoroterephthalic acid, 5-trifluoromethylisophthalic acid, 9,9-bis(2-carboxyphenyl)fluorene, 9,9-bis(3-carboxyphenyl)fluorene, 9,9-bis(4-carboxyphenyl)fluorene, bis((2-carboxy-3-phenyl)phenyl)fluorene, bis((4-carboxy-3-phenyl)phenyl)fluorene, bis((5-carboxy-3-phenyl)phenyl)-fluorene, bis((6-carboxy-3-phenyl)phenyl)fluorene, 9,9-bis(4-(2-carboxyphenoxy)phenyl)fluorene, 9,9-bis(4-(3-carboxyphenoxy)phenyl)-fluorene, 9,9-bis(4-(4-carboxyphenoxy)phenyl)fluorene, 9,9-bis((4-(2-carboxyphenoxy)-3-phenyl)phenyl)fluorene, 9,9-bis((4-(3-carboxyphenoxy)-3-phenyl)phenyl)fluorene and 9,9-bis((4-(4-carboxyphenoxy)-3-phenyl)-phenyl)fluorene. The above compounds may be used singly or in combination of two or more.

The hydrogen atoms on the benzene ring in the groups represented by general formulae (A), (B), (C), (D), (E), (F) and (G) may be substituted with at least one atom or group selected from alkyl groups having 1 to 4 carbon atoms, fluorine atom and trifluoromethyl group. Examples of the alkyl group having 1 to 4 carbon atoms include methyl group, ethyl group, propyl group, isopropyl group, butyl group, isobutyl group and t-butyl group.

The precursor of a polybenzoxazole resin of the present invention can be brought into the condensation reaction and the crosslinking reaction by heating and a polybenzoxazole resin can be obtained. In general formula [1] representing the structure in the precursor, m and n represent integers the total of which is 2 to 1,000 and preferably 5 to 100. When the above total exceeds 1,000, viscosity of a varnish prepared by dissolving the precursor is great and handling becomes difficult. Therefore, such a value is not preferable from the standpoint of practical application. m and n satisfy the relation:

$0.05 \leq m/(m+n) \leq 1$ and preferably the relation:

$0.5 \leq m/(m+n) \leq 1$

The values of m and n satisfying the relation:

$(m/m+n) < 0.05$ mean that the number of the repeating unit having the crosslinking group is small and such a structure is not preferable since the number available for the crosslinking is small and heat resistance is not much improved. The repeating units having the crosslinking group and the repeating units having no crosslinking groups may be arranged in a block arrangement or in a random arrangement.

The precursor of a polybenzoxazole resin of the present invention can be produced in accordance with the processes described above. For example, when the precursor of a polybenzoxazole is prepared in accordance with the acid chloride process, dicarboxylic acid and thionyl chloride in an excess amount are reacted at a temperature in the range of the room temperature to about 130° C. in the presence of a catalyst such as N,N-dimethylformamide. After the remaining amount of thionyl chloride is removed by heating under a reduced pressure, the residue is recrystallized from a solvent such as hexane and a dicarboxylic acid chloride is prepared. The prepared dicarboxylic acid chloride is dissolved, in general, into a polar solvent such as N-methyl-2-pyrrolidone and N,N-dimethylacetamide in combination with a bisaminophenol compound. The reaction is allowed to proceed in the prepared mixture at a temperature in the range of the room temperature to about −30° C. in the presence of an acid acceptor such as pyridine and the precursor of a polybenzoxazole is obtained. In the precursor of a polybenzoxazole resin which is obtained from at least one of the bisaminophenol compounds having a tetravalent group selected from the groups represented by general formulae (A) and at least one of dicarboxylic acid having a divalent group selected from the groups represented by general formulae (B), (C), (D) and (E), the repeating units may be arranged in a block arrangement or in a random arrangement.

In the structure represented by general formula [1], the repeating units having the crosslinking group and the repeating units having no crosslinking groups may be arranged in a block arrangement or in a random arrangement. The structure having the repeating units arranged in a block arrangement can be produced, for example, in accordance with the following acid chloride process. A bisaminophenol compound having a tetravalent group selected from the groups represented by formulae (A) and a chloride of a dicarboxylic acid having a divalent group selected from the groups represented by formulae (F) are reacted in advance and the molecular weight is raised. Then, the bisaminophenol compound having a tetravalent group selected from the groups represented by formulae (A) and a chloride of a dicarboxylic acid having a structure contributing to crosslinking which is selected from the divalent groups represented by formulae (B), (C), (D) and (E) are reacted.

The order in the above reactions may be reversed. A bisaminophenol compound having a tetravalent group selected from the groups represented by formulae (A) and a chloride of a dicarboxylic acid having a structure contributing to crosslinking which is selected from the divalent groups represented by formulae (B), (C), (D) and (E) may be reacted in advance and the molecular weight is raised. Then, the bisaminophenol compound having a tetravalent group selected from the groups represented by formulae (A) and a chloride of a dicarboxylic acid having a divalent group selected from the groups represented by formulae (F) may be reacted.

The structure having the repeating units arranged in a random arrangement can be produced by simultaneously reacting a bisaminophenol compound having a tetravalent group selected from the groups represented by formulae (A), a chloride of a dicarboxylic acid having a structure contributing to crosslinking which is selected from the divalent groups represented by formulae (B), (C), (D) and (E) and a chloride of a dicarboxylic acid having a divalent group selected from the groups represented by formulae (F).

In the present invention, the organic solvent used for dissolving the precursor of a polybenzoxazole resin so that the prepared solution can be used as the material for insulating films is different depending on the structure of the dissolved solute. Examples of the organic solvent include propylene carbonate, diacetone alcohol, N-methyl-2-pyrrolidone γ-butyrolactone, N,N-dimethylacetamide, dimethylsulfoxide, diethylene glycol dimethyl ether, diethylene glycol diethyl ether, diethylene glycol dibutyl ether, propylene glycol monomethyl ether, propylene glycol monopropyl ether, propylene glycol mono-n-butyl ether, propylene glycol diacetate, dipropylene glycol monomethyl ether, propylene glycol monomethyl ether acetate, methyl lactate, ethyl lactate, butyl lactate, methyl-1,3-propylene glycol acetate, 1,3-butylene glycol 3-monomethyl ether, methyl pyruvate, ethyl pyruvate and methyl 3-methoxypropionate. The organic solvents may be used singly or in combination of two or more.

The precursor of a polybenzoxazole resin of the present invention is used, for example, in the following manner. A varnish is prepared by dissolving the precursor of a polybenzoxazole resin into a solvent such as N-methyl-2-pyrrolidone and a suitable support such as a silicon wafer or a ceramic base plate is coated with the varnish. Examples of the coating process include the spin coating process using a spinner, the spray coating process using a spray coater, the dipping process, the printing process and the roll coating process. The coated film is dried. Then, the dried coating film is treated by heating so that the solvent is removed, the condensation reaction and the crosslinking reaction take place and the precursor is converted into the polybenzoxazole resin. The obtained film can be used as the insulating film.

The material used for the insulating film of the present invention may further comprise various additives, where necessary. Examples of the additive include coupling agents such as silane coupling agents and radical generators which generate radicals such as oxygen radical and sulfur radical by heating. A photosensitive resin composition can be prepared by using the precursor of a polybenzoxazole in combination with a naphthoquinone diazide compound as the photosensitive agent.

The semiconductor device of the present invention comprises at least one of insulating interlayer films of multi-layer wiring and films for protecting surfaces which comprise the above insulating film comprising the polybenzoxazole resin.

The insulating film of the present invention may be used, for example, as the insulating interlayer films of multi-layer wiring in semiconductor devices. For enhancing adhesion, a semiconductor substrate is coated with an adhesive coating material and an adhesive coating film is formed. Examples of the process for forming the coating film include the spin coating process using a spinner, the spray coating process using a spray coater, the dipping process, the printing process and the roll coating process. The coating film is prebaked at a temperature above the boiling point of the organic solvent so that the organic solvent is removed by vaporization and the coating film is dried and an adhesive coating film is formed.

Then, the adhesive coating film obtained above is coated with the solution of the material for the insulating film of the present invention in accordance with the same process as that conducted above and a laminate structure is formed. A coating film thus formed is prebaked under the same condition as that described above so that the organic solvent is removed by vaporization and the film is dried. After the heat treatment of the film, an insulating interlayer film can be formed.

A film for protecting the surface can be formed by forming a film in accordance with similar procedures.

To summarize the advantages of the present invention, the precursor of a polybenzoxazole resin of the present invention exhibits excellent solubility into organic solvents and, after being converted into the polybenzoxazole resin, excellent properties under heating and is advantageously used for insulating interlayer films and films for protecting surfaces in semiconductors, insulating interlayer films of multi-layer circuits, cover coats of flexible copper clad laminates, solder resist films and liquid crystal-aligning films.

EXAMPLES

The present invention will be described more specifically with reference to examples in the following. However, the present invention is not limited to the examples.

The glass transition temperature, the heat decomposition temperature, the solubility and the dielectric constant of a polymer and a film prepared from the polymer synthesized in Examples and Comparative Examples were measured in accordance with the following methods.

(1) Glass transition temperature

The thermomechanical property of a film was measured using an instrument DMS6100 manufactured by SEIKO INSTRUMENTS Co., Ltd. under a flow of the nitrogen gas at 300 ml/minute under dynamic deformation at a frequency of 1 Hz while the temperature was raised at a rate of 3° C./minute. The peak top temperature of tan δ was used as the glass transition temperature.

(2) Heat decomposition temperature

The thermogravimetric analysis of a film was conducted using an instrument TG/DTA220 manufactured by SEIKO INSTRUMENTS Co., Ltd. under a flow of the nitrogen gas at 200 ml/minute while the temperature was raised at a rate of 10° C./minute. The temperature at which the decrease in the weight reached 5% was used as the heat decomposition temperature.

(3) Solubility

A precursor of a polybenzoxazole in an amount of 1 g and 3 g of N-methyl-2-pyrrolidone were accurately weighed and placed into a glass sample container having a cap. After the content of the container was stirred by a stirrer rod for 1 hour, the condition of the content was visually observed. When no insoluble substances were found, the solubility was evaluated as good and, when an insoluble substance was found, the solubility was evaluated as poor.

(4) Dielectric constant

The electric capacity of a film was measured in accordance with the method of Japanese Industrial Standard K6911 using HP-4284A PRECISION LCR METER manufactured by HEWLETT PACKARD Company at a frequency of 100 kHz. The dielectric constant was calculated from the obtained electric capacity in accordance with the following equation:

Dielectric constant=(electric capacity×thickness of film) / (permittivity in vacuum×area of measurement)

Preparation Example 1

Preparation of 5-ethynylisophthalic acid dichloride (1) Synthesis of dimethyl 5-trifluoromethanesulfonyloxyisophthalate Into a 5 liter four-necked flask equipped with a thermometer, a Dimroth condenser, a tube containing calcium chloride and a stirrer, 190.0 g (0.904 mole) of dimethyl 5-hydroxyisophthlate, 3 liters of dehydrated toluene and 214.7 g (2.718 mole) of dehydrated pyridine were placed and the resultant mixture was cooled to −30° C. while being stirred. To the cooled mixture, 510.2 g (1.808 mole) of anhydrous trifluorosulfonic acid was added dropwise slowly and carefully so that the temperature was not raised at −25° C. or higher. It took 1 hour before the addition was completed. After the addition was completed, the temperature of the reaction mixture was raised to 0° C. and the reaction was allowed to proceed for 1 hour. The temperature was then raised to the room temperature and the reaction was allowed to proceed for 5 hours. The obtained reaction mixture was poured into 4 liters of ice water and the aqueous layer and the organic layer were separated. The aqueous layer was treated twice by extraction with 500 ml of toluene and the extracts were combined with the organic layer. The combined organic solution was washed twice with 3 liters of water and dried with 100 g of anhydrous magnesium sulfate. Anhydrous magnesium sulfate was removed by filtration and toluene was removed by distillation using a rotary evaporator. The resultant product was dried in vacuo and 294.0 g (the yield: 95%) of dimethyl 5-trifluoromethanesulfonyloxyisophthalate was obtained as a light yellow solid. The crude product was recrystallized from hexane and white needle crystals were obtained. The crystals were used for the next reaction.

(2) Synthesis of 4-[3,5-bis(methoxycarbonyl)phenyl]-2-methyl-3-butyn-1-ol

Into a 1 liter four-necked flask equipped with a thermometer, a Dimroth condenser, an inlet for the nitrogen gas and a stirrer, 125 g (0.365 mole) of dimethyl 5-trifluoromethanesulfonyloxyisophthalate, 1.1 g (0.0419 mole) of triphenylphosphine, 0.275 g (0.00144 mole) of copper iodide and 33.73 g (0.401 mole) of 3-methyl-1-butyn-3-ol were placed and the nitrogen gas was passed through the flask. To the above mixture, 375 ml of dehydrated triethylamine and 200 ml of dehydrated pyridine were added and dissolved by stirring the mixture. After the flow of the nitrogen gas was continued for 1 hour, 0.3 g (0.000427 mole) of dichlorobis-(triphenylphosphine)palladium was quickly added and the resultant mixture was heated under the refluxing condition in an oil bath for 1 hour. Then, triethylamine and pyridine were removed by distillation in vacuo and a viscous brown solution was obtained. The solution was poured into 500 ml of water and the formed solid substances were separated by filtration and washed twice with 500 ml of water, 500 ml of a hydrochloric acid having a concentration of 5 mole/liter and 500 ml of water. The obtained solid substance was dried at 50° C. in vacuo and 98.8 g (the yield: 98%) of 4-[3,5-bis(methoxycarbonyl)phenyl]-2-methyl-3-butyn-1-ol was obtained.

(3) Synthesis of dipotassium 5-ethynylisophthalate

Into a 5 liter four-necked flask equipped with a thermometer, a Dimroth condenser and a stirrer, 3 liters of n-butanol and 182 g (2.763 mole) of potassium hydroxide (85%) were placed and potassium hydroxide was dissolved into n-butanol by heating under the refluxing condition. To the resultant solution, 95 g (0.344 mole) of 4-[3,5-bis(methoxycarbonyl)-phenyl]-2-methyl-3-butyn-1-ol synthesized above in (2) was added and the resultant mixture was heated under the refluxing condition for 30 minutes. The mixture was then cooled in an ice bath. The formed crystals were separated by filtration, washed twice with 1 liter of methanol and dried at 60° C. in vacuo and 88.87 g (the yield: 97%) of dipotassium 5-ethynylisophthalate was obtained.

(4) Synthesis of 5-ethynylisophthalic acid dichloride

Into a 2 liter four-necked flask equipped with a thermometer, a Dimroth condenser and a stirrer, 80 g (0.3 mole) of dipotassium 5-ethynylisophthalate obtained above in (3) and 400 ml of chloroform were placed and the resultant mixture was cooled to 0° C. To the cooled mixture, 391 g (4.5 mole) of thionyl chloride was added dropwise at a temperature of 5° C. or lower over 1 hour. Then, 4 ml of dimethyl-formamide and 4 g of hydroquinone were added and the resultant mixture was stirred at 45 to 50° C. for 3 hours. After the reaction mixture was cooled, crystals were separated by filtration and washed with 150 ml of chloroform. The filtrate and the washing liquid were combined and concentrated at a temperature of 40° C. or lower. The obtained residue was treated twice by extraction with 200 ml of diethyl ether and filtered. Diethyl ether was removed from the extract by distillation in vacuo and a semi-solid crude product was obtained. The crude product was then washed with dry n-hexane and recrystallized from diethyl ether and 13 g (the yield: 19%) of 5-ethynylisophthalic acid dichloride was obtained.

In accordance with the procedures similar to those conducted above, 5-ethynylterephthalic acid dichloride was obtained.

Preparation Example 2

Preparation of 5-phenylethynylisophthalic acid dichloride (1) Synthesis of 5-bromoisophthalic acid Into a 1 liter four-necked flask equipped with a thermometer, a stirrer and a dropping funnel, 99.18 g (0.55 mole) of 5-aminoisophthalic acid, 165 ml of a 48% by weight hydrobromic acid and 150 ml of distilled water were placed and stirred. To the obtained solution, a solution prepared by dissolving 39.4 g (0.57 mole) of sodium nitrite into 525 ml of distilled water was added dropwise over 1 hour and an aqueous solution of a diazonium salt was obtained. Into a 3 liter four-necked flask equipped with a thermometer, a Dimroth condenser, a dropping funnel and a stirrer, 94.25 g (0.66 mole) of copper(I) bromide and 45 ml of a 48% by weight hydrobromic acid were placed and stirred. The resultant mixture was cooled at a temperature of 0° C. or lower and the aqueous solution of a diazonium salt prepared above was added dropwise over 2 hours. After the addition was completed, the reaction mixture was stirred at the room temperature for 30 minutes and then heated under the refluxing condition for 30 minutes. After the reaction mixture was left standing and cooled, the formed precipitates were separated by filtration and washed twice with 2 liters of water. The obtained white solid was dried in vacuo at 50° C. for 2 days and 117 g of a crude product was obtained. The product was used in the following step without purification.

(2) Synthesis of dimethyl 5-bromoisophthalate

Into a 500 ml flask equipped with a stirrer and a Dimroth condenser, 110 g of 5-bromoisophthalic acid obtained above in (1), 500 ml of methanol and 10 g of a concentrated sulfuric acid were placed and heated under the refluxing condition for 6 hours. After the resulting mixture was left standing and cooled, the mixture was added dropwise to 1 liter of distilled water. The obtained solution was neutralized with a 5% by weight aqueous solution of sodium hydrogencarbonate. The formed precipitates were separated by filtration and washed twice with 2 liters of distilled water. The obtained white solid was dried in vacuo at 50° C. for 2 days and 109 g (0.4 mole; the yield: 89%) of dimethyl 5-bromoisophthalate was obtained.

(3) Synthesis of 5-phenylethynylisophthalic acid dichloride

In accordance with the same procedures as those conducted in (2) in Preparation Example 1 except that 99.7 g (0.365 mole) of dimethyl 5-bromoisophthalate was used in place of 125 g (0.365 mole) of dimethyl 5-trifluoromethanesulfonyloxyisophthalate, 80.8 g (the yield: 75%) of 1-[3,5-bis(methoxycarbonyl)phenyl]-2-phenylethyne was obtained.

In accordance with the same procedures as those conducted in (3) and (4) in Preparation Example 1, dipotassium 5-(2-phenylethynyl)-isophthalate and 5-(2-phenylethynyl)isophthalic acid dichloride, successively, were obtained.

Preparation Example 3

Preparation of 4,4'-tolanedicarboxylic acid dichloride (1) Synthesis of methyl 4-ethynylbenzoate In accordance with the process described in J. Org. Chem., Volume 57, Pages 6998 to 6999 (1962), 4-ethynylbenzoic acid chloride was synthesized.

Then, a solution prepared by dissolving 24.7 g (0.15 mole) of 4-ethynylbenzoic acid chloride in 30 ml of tetrahydrofuran was added dropwise into 300 ml of methanol cooled in an ice bath. After the addition was completed, the reaction solution became turbid in 20 minutes. The reaction mixture was kept being stirred for 2 hours in the ice bath and then stirred at the room temperature for further 2 hours. The reaction mixture was filtered and dried and 21 g (the yield: 87%) of methyl 4-ethynylbenzoate was obtained.

(2) Synthesis of dimethyl 4,4'-tolandicarboxylate

A mixture containing 16.0 g (0.1 mole) of methyl 4-ethynylbenzate obtained above in (1), 21.5 g (0.1 mole) of methyl 4-bromobenzoate, 0.288 g (0.0011 mole) of triphenylphosphine, 0.07 g (0.00037 mole) of copper(I) iodide, 250 ml of triethylamine and 37.5 ml of pyridine was stirred and the temperature was raised until the refluxing started at 87° C. Then, the temperature was lowered until the refluxing stopped. At this temperature, 0.098 g (0.00014 mole) of dichlorobis(triphenylphosphine)-palladium was added and the resultant mixture was heated under the refluxing condition for 3 hours. The reaction mixture was cooled and concentrated using a rotary evaporator. The formed precipitates were separated by filtration, dried and washed twice with 500 ml of ethyl acetate.

The obtained product was placed into tetrahydrofuran and stirred under heating. Then, the mixture was filtered at a high temperature. After recrystallization from the obtained filtrate, 14.7 g (the yield: 50%) of dimethyl 4,4'-tolandicarboxylate was obtained.

(3) Synthesis of 4,4-tolandicarboxylic acid dichloride

Potassium hydroxide in an amount of 16.83 g (0.3 mole) was dissolved into 450 ml of methanol. After 8.22 g (0.033 mole) of dimethyl tolandicarboxylate obtained above in (2) was added to the resultant solution, the temperature was raised and the mixture was heated under the refluxing condition for 18 hours. The reaction mixture was then cooled. The formed precipitates were recovered by filtration and dissolved into 1 liter of water. After insoluble residues in the solution was removed by filtration, pH of the filtrate was slowly adjusted to 3 with a hydrochloric acid having a concentration of 0.1 mole/liter. The formed precipitates of 4,4'-tolandicarboxylic acid were separated by filtration and dried and 6.7 g (the yield: 76%) of 4,4'-tolandicarboxylic acid was obtained.

4,4'-Tolandicarboxylic acid obtained above in an amount of 6.5 g (0.024 mole), 60 ml of 1,2-dichloroethane, 10.013 g of benzyl triethylammonium chloride and 3.9 ml of thionyl chloride were mixed together. The temperature was raised and the mixture was heated under the refluxing condition for 10 hours. To the resultant reaction mixture, 40 ml of n-hexane was added. The resultant mixture was filtered at a high temperature and crystals were obtained from the filtrate. The crystals were recrystallized from a mixed solvent of 1,2-dichloroethane and hexane and 3 g (the yield: 41%) of 4,4'-tolandicarboxylic acid dichloride was obtained.

In accordance with the procedures similar to those conducted above, 3,4'-tolandicarboxylic acid dichloride was prepared.

Preparation Example 4

Preparation of 2,2'-bis(phenylethynyl)-4,4'-biphenyldicarboxylic acid dichloride (1) Synthesis of dimethyl 2,2'-bis(phenylethynyl)-4,4'-biphenyl-dicarboxylate Dimethyl 4,4'-biphenyldicarboxylate in an amount of 25 g (0.092 mole) was added into 300 ml of a concentrated sulfuric acid in combination with 55 g (0.22 mole) of iodine. As the catalyst, 85 g of silver sulfate was added and the resultant mixture was stirred at the room temperature for 1 hour. The temperature was raised to 80° C. and the reaction mixture was stirred for 18 hours. The reaction mixture was added dropwise to ice water and yellow precipitates were obtained. The precipitates were washed twice with water, filtered and dried at 80° C. in vacuo for 24 hours. The obtained dried product was purified by extraction with methanol using a Soxhlet extractor for 24 hours and recrystallized from methanol and 41 g (the yield: 85%) of dimethyl 2,2'-diiodo-4,4'-biphenyldicarboxylate was obtained as yellow crystals.

Dimethyl 2,2'-diiodo-4,4'-biphenyldicarboxylate obtained above in an amount of 26 g (0.05 mole), 0.08 g of copper iodide and 0.11 g of bis(triphenylphosphine)palladium were added into 120 ml of pyridine and the mixture was stirred at the room temperature for 1 hour. To the resultant reaction mixture, a solution prepared by adding 12.5 g (0.122 mole) of phenylacetylene into 60 ml of pyridine was slowly added. The temperature of the obtained mixture was raised to 80° C. and the mixture was kept being stirred at this temperature for 5 hours. The mixture was then cooled to the room temperature and the precipitated salts were removed by filtration. After pyridine was removed by distillation using a rotary evaporator, a crude product was obtained. The crude product was dissolved into 200 ml of diethyl ether and washed with a 5% by weight hydrochloric acid and water. After recrystallization from a mixed solvent of hexane and toluene (90/10 v/v), 16 g (the yield: 68%) of dimethyl 2,2'-bis(phenylethynyl)-4,4'-biphenyldicarboxylate was obtained.

(2) Synthesis of 2,2'-bis(phenylethynyl)-4,4'-biphenyldicarboxylic acid dichloride A mixture containing 14 g (0.03 mole) of dimethyl 2,2'-bis(phenylethynyl) -4,4'-biphenyldicarboxylate obtained above in (1) and 120 ml of an ethanol solution of potassium hydroxide having a concentration of 1 mole/liter were heated under the refluxing condition for 2 hours. The protection was removed with a dilute hydrochloric acid and yellow precipitates were obtained. The precipitates were separated by filtration, dried and recrystallized from a mixed solvent of toluene and methanol (90/10 v/v) and 12 g (the yield: 90%) of 2,2'-bis(phenylethynyl)-4,4'-biphenyldicarboxylic acid was obtained.

A mixture of 4.5 g (0.01 mole) of 2,2'-bis(phenylethynyl)-4,4'-biphenyldicarboxylic acid obtained above, 1 ml of N,N-dimethylformamide and 100 ml of thionyl chloride was heated under the refluxing condition for 6 hours and then the remaining thionyl chloride was removed by distillation in vacuo. The obtained crude product was recrystallized from a mixed solvent of hexane and chloroform (90/10 v/v) and 4.0 g (the yield: 82%) of 2,2'-bis(phenylethynyl)-4,4'-biphenyldicarboxylic acid dichloride was obtained.

In accordance with the procedures similar to those conducted above, 2,2'-bis(naphthylethynyl)-4,4'-biphenyldicarboxylic acid dichloride was prepared.

Preparation Example 5

Preparation of 2,7-biphenylenedicarboxylic acid dichloride

In accordance with the process described in J. Poly. Sci.: Polymer Letters Edition, Volume 16, Pages 653 to 656 (1978), 2,7-biphenylene-dicarboxylic acid dichloride was prepared.

Preparation Example 6

Preparation of 2,6-biphenylenedicarboxylic acid dichloride

In accordance with the process described in American Chemical Society, Volume 11, No. 3, Pages 479 to 483 (1978), 2,6-biphenylene-dicarboxylic acid dichloride was prepared.

Example 1

Under a flow of the nitrogen gas, 36.6 g (0.1 mole) of 2,2-bis(3-amino-4-hydroxyphenyl)hexafluoropropane was dissolved into 200 g of dry N-methyl-2-pyrrolidone and 17.4 g (0.22 mole) of pyridine was added to the resultant solution. After the obtained solution was cooled to −15° C., 21.6 g (0.095 mole) of 5-ethynylterephthalic acid dichloride was added dropwise slowly. After the addition was completed, the resultant mixture was stirred at −15° C. for 1 hour. Then, the temperature was raised to the room temperature and the reaction mixture was stirred at the room temperature for 5 hours. The reaction mixture was added dropwise to 4 liters of distilled water in a manner such that the droplets were very small. After the formed precipitates were separated and dried, a precursor of a polybenzoxazole resin was obtained. The number-average molecular weight (Mn) of the obtained precursor of a polybenzoxazole resin was obtained as the value of corresponding polystyrene in accordance with GPC using an apparatus manufactured by TOSO Co., Ltd. and was found to be 19,000.

The obtained precursor of a polybenzoxazole resin in an amount of 10 g was dissolved in 50 g of N-methyl-2-pyrrolidone. The obtained solution was filtered through a Teflon filter having a pore size of 200 nm and a varnish for coating was obtained. A glass plate was coated with the varnish using a doctor knife. The coated glass plate was heated in an oven under the nitrogen atmosphere at 70° C. for 1 hour, at 150° C. for 30 minutes and at 420° C. for 1 hour, successively, and a film was obtained. The properties of the obtained film are shown in Table 1.

Example 2

A precursor of a polybenzoxazole resin was obtained in accordance with the same procedures as those conducted in Example 1 except that 31.1 g (0.095 mole) of 5,5'-diethynyl-3,3'-biphenyldicarboxylic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 16,000. Using the above precursor of a polybenzoxazole resin, a film was prepared in accordance with the same procedures as those conducted in Example 1. The properties of the prepared film are shown in Table 1.

Example 3

A precursor of a polybenzoxazole resin was obtained in accordance with the same procedures as those conducted in Example 1 except that 21.6 g (0.095 mole) of 5-ethynylisophthalic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 18,000. Using the above precursor of a polybenzoxazole resin, a film was prepared in accordance with the same procedures as those conducted in Example 1. The properties of the prepared film are shown in Table 1.

Example 4

A precursor of a polybenzoxazole resin was obtained in accordance with the same procedures as those conducted in Example 1 except that 28.8 g (0.095 mole) of 5-phenyethynylisophthalic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 16,000. Using the above precursor of a polybenzoxazole resin, a film was prepared in accordance with the same procedures as those conducted in Example 1. The properties of the prepared film are shown in Table 1.

Example 5

A precursor of a polybenzoxazole resin was obtained in accordance with the same procedures as those conducted in Example 1 except that 28.8 g (0.095 mole) of 4,4'-tolandicarboxylic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 13,000. Using the above precursor of a polybenzoxazole resin, a film was prepared in accordance with the same procedures as those conducted in Example 1. The properties of the prepared film are shown in Table 1.

Example 6

A precursor of a polybenzoxazole resin was obtained in accordance with the same procedures as those conducted in Example 1 except that 28.8 g (0.095 mole) of 3,4'-tolandicarboxylic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 14,000. Using the above precursor of a polybenzoxazole resin, a film was prepared in accordance with the same procedures as those conducted in Example 1. The properties of the prepared film are shown in Table 1.

Example 7

A precursor of a polybenzoxazole resin was obtained in accordance with the same procedures as those conducted in Example 1 except that 20.2 g (0.0665 mole) of 4,4'-tolandicarboxylic acid dichloride and 5.8 g (0.0285 mole) of isophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 13,000. Using the above precursor of a polybenzoxazole resin, a film was prepared in accordance with the same procedures as those conducted in Example 1. The properties of the prepared film are shown in Table 1.

Example 8

A precursor of a polybenzoxazole resin was obtained in accordance with the same procedures as those conducted in Example 1 except that 1.4 g (0.005 mole) of 2,6-biphenylenedicarboxylic acid dichloride and 18.9 g (0.093 mole) of isophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 20,500. Using the above precursor of a polybenzoxazole resin, a film was prepared in accordance with the same procedures as those conducted in Example 1. The properties of the prepared film are shown in Table 1.

Example 9

A precursor of a polybenzoxazole resin was obtained in accordance with the same procedures as those conducted in Example 1 except that 13.6 g (0.049 mole) of 2,6-biphenylenedicarboxylic acid dichloride and 9.9 g (0.049 mole) of isophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 22,000. Using the above precursor of a polybenzoxazole resin, a film was prepared in accordance with the same procedures as those conducted in Example 1. The properties of the prepared film are shown in Table 1.

Example 10

A precursor of a polybenzoxazole resin was obtained in accordance with the same procedures as those conducted in Example 1 except that 27.2 g (0.098 mole) of 2,7-biphenylenedicarboxylic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 23,000. Using the above precursor of a polybenzoxazole resin, a film was prepared in accordance with the same procedures as those conducted in Example 1. The properties of the prepared film are shown in Table 1.

Example 11

A precursor of a polybenzoxazole resin was obtained in accordance with the same procedures as those conducted in Example 1 except that 56.5 g (0.1 mole) of 9,9-bis((4-amino-3-hydroxy)phenyl)fluorene was used in place of 36.6 g (0.1 mole) of 2,2-bis(3-amino-4-hydroxyphenyl)-hexafluoropropane and 5.4 g (0.024 mole) of 5-ethynylisophthalic acid dichloride and 21.5 g (0.071 mole) of 5-phenylethynylisophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 15,000. Using the above precursor of a polybenzoxazole resin, a film was prepared in accordance with the same procedures as those conducted in Example 1. The properties of the prepared film are shown in Table 1.

Example 12

A precursor of a polybenzoxazole resin was obtained in accordance with the same procedures as those conducted in Example 1 except that 56.5 g (0.1 mole) of 9,9-bis((4-amino-3-hydroxy)phenyl)fluorene was used in place of 36.6 g (0.1 mole) of 2,2-bis(3-amino-4-hydroxyphenyl)-hexafluoropropane and 9.6 g (0.0425 mole) of 5-ethynylterephthalic acid dichloride, 12.9 g (0.0425 mole) of 5-phenylethynylisophthalic acid dichloride and 2.0 g (0.01 mole) of terephthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 14,000. Using the above precursor of a polybenzoxazole resin, a film was prepared in accordance with the same procedures as those conducted in Example 1. The properties of the prepared film are shown in Table 1.

Example 13

Under a flow of the nitrogen gas, 36.6 g (0.1 mole) of 2,2-bis(3-amino-4-hydroxyphenyl)hexafluoropropane was dissolved into 150 g of dry N-methyl-2-pyrrolidone and 15.8 g (0.2 mole) of pyridine was added to the resultant solution. After the obtained solution was cooled to −15° C., a solution prepared by dissolving 45.5 g (0.095 mole) of 2,2'-bis(phenylethynyl)-4,4'-biphenyldicarboxylic acid dichloride in 400 g of γ-butyrolactone was added slowly. After the addition was completed, the resultant mixture was stirred at −15° C. for 1 hour. Then, the temperature was raised to the room temperature and the reaction mixture was stirred at the room temperature for 5 hours. The reaction mixture was added dropwise to 6 liters of distilled water in a manner such that the droplets were very small. After the formed precipitates were separated and dried, 64 g of a precursor of a polybenzoxazole resin was obtained. The number-average molecular weight (Mn) of the obtained precursor of a polybenzoxazole resin was obtained as the value of corresponding polystyrene in accordance with GPC using an apparatus manufactured by TOSO Co., Ltd. and was found to be 15,000. Using the above precursor of a polybenzoxazole resin, a film was prepared in accordance with the same procedures as those conducted in Example 1. The properties of the prepared film are shown in Table 1.

Example 14

A precursor of a polybenzoxazole resin in an amount of 66 g was obtained in accordance with the same procedures as those conducted in Example 13 except that 55.0 g (0.095 mole) of 2,2'-bis(naphthylethynyl)-4,4'-biphenyldicarboxylic acid dichloride was used in place of 45.5 g (0.095 mole) of 2,2'-bis(phenylethynyl)-4,4'-biphenyldicarboxylic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 18,000. Using the above precursor of a polybenzoxazole resin, a film was prepared in accordance with the same procedures as those conducted in Example 1. The properties of the prepared film are shown in Table 1.

Example 15

A precursor of a polybenzoxazole resin in an amount of 57 g was obtained in accordance with the same procedures as those conducted in Example 13 except that 31.9 g (0.0665 mole) of 2,2'-bis(phenylethynyl)-4,4'-biphenyldicarboxylic acid dichloride and 5.79 g (0.0285 mole) of isophthalic acid dichloride were used in place of 45.5 g (0.095 mole) of 2,2'-bis(phenylethynyl)-4,4'-biphenyldicarboxylic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 13,000. Using the above precursor of a polybenzoxazole resin, a film was prepared in accordance with the same procedures as those conducted in Example 1. The properties of the prepared film are shown in Table 1.

Comparative Example 1

A precursor of a polybenzoxazole resin was obtained in accordance with the same procedures as those conducted in Example 1 except that 21.6 g (0.1 mole) of 4,4'-diamino-3,3'-dihydroxybiphenyl was used in place of 2,2-bis(3-amino-4-hydroxyphenyl)hexafluoropropane and 19.3 g (0.095 mole) of isophthalic acid dichloride was used in place of 21.6 g (0.095 mole) of 5-ethynylterephthalic acid dichloride.

Using the above precursor of a polybenzoxazole resin, preparation of a varnish was attempted in accordance with the same procedures as those conducted in Example 1. However, the varnish contained a great amount of insoluble substances and no films could be prepared. Therefore, a sample was prepared by heat treating powder of the precursor of a polybenzoxazole resin under the same condition as that in Example 1. The measurement of the glass transition temperature of the treated sample was attempted using MDSC (a modulated differential scanning calorimeter; manufactured by TA INSTRUMENTS Co., Ltd.; 2910MDSC) under the condition of a rate of temperature elevation of 2° C./minute, an amplitude of temperature of ±2° C. and a flow speed of the nitrogen gas of 30 ml/minute. No transition points were observed up to the temperature of 420° C. The heat decomposition temperature was measured in accordance with the same method as that used for a film. The results are shown in Table 1.

Comparative Example 2

A precursor of a polybenzoxazole resin was obtained in accordance with the same procedures as those conducted in Example 1 except that 19.3 g (0.095 mole) of terephthalic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 13,000. Using the above precursor of a polybenzoxazole resin, a film was prepared in accordance with the same procedures as those conducted in Example 1. The properties of the prepared film are shown in Table 1.

Comparative Example 3

A precursor of a polybenzoxazole resin was obtained in accordance with the same procedures as those conducted in Example 1 except that 19.9 g (0.098 mole) of isophthalic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 24,000. Using the above precursor of a polybenzoxazole resin, a film was prepared in accordance with the same procedures as those conducted in Example 1. The properties of the prepared film are shown in Table 1.

Comparative Example 4

A precursor of a polybenzoxazole resin was obtained in accordance with the same procedures as those conducted in Example 1 except that 27.4 g (0.098 mole) of 4,4'-biphenyldicarboxylic acid dichloride was used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 23,000. Using the above precursor of a polybenzoxazole resin, a film was prepared in accordance with the same procedures as those conducted in Example 1. The properties of the prepared film are shown in Table 1.

Comparative Example 5

A precursor of a polybenzoxazole resin was obtained in accordance with the same procedures as those conducted in Example 1 except that 0.28 g (0.01 mole) of 2,6-biphenylenedicarboxylic acid dichloride and 19.7 g (0.097 mole) of isophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 23,000. Using the above precursor of a polybenzoxazole resin, a film was prepared in accordance with the same procedures as those conducted in Example 1. The properties of the prepared film are shown in Table 1.

Comparative Example 6

A precursor of a polybenzoxazole resin was obtained in accordance with the same procedures as those conducted in Example 1 except that 56.5 g (0.1 mole) of 9,9-bis((4-amino-3-hydroxy)phenyl)fluorene was used in place of 36.6 g (0.1 mole) of 2,2-bis(3-amino-4-hydroxyphenyl)-hexafluoropropane and 11.8 g (0.0425 mole) of 4,4'-biphenyldicarboxylic acid dichloride, 8.6 g (0.0425 mole) of terephthalic acid dichloride and 2.0 g (0.01 mole) of isophthalic acid dichloride were used in place of 21.6 g (0.095 mole) of 5-ethynylterephthalic acid dichloride. The number-average molecular weight (Mn) of the obtained precursor of a polybenzoxazole resin was obtained as the value of corresponding polystyrene in accordance with GPC using an apparatus manufactured by TOSO Co., Ltd. and was found to be 13,000. Using the above precursor of a polybenzoxazole resin, a film was prepared in accordance with the same procedures as those conducted in Example 1. The properties of the prepared film are shown in Table 1.

Comparative Example 7

A precursor of a polybenzoxazole resin was obtained in accordance with the same procedures as those conducted in Example 1 except that 21.6 g (0.1 mole) of 4,4'-diamino-3,3'-dihydroxybiphenyl was used in place of 2,2-bis(3-amino-4-hydroxyphenyl)hexafluoropropane and 19.3 g (0.095 mole) of terephthalic acid dichloride was used in place of 21.6 g (0.095 mole) of 5-ethynylterephthalic acid dichloride.

Using the above precursor of a polybenzoxazole resin, preparation of a varnish was attempted in accordance with the same procedures as those conducted in Example 1. However, the varnish contained a great amount of insoluble substances and no films could be prepared. Therefore, a sample was prepared by heat treating powder of the precursor of a polybenzoxazole resin under the same condition as that in Example 1. The measurement of the glass temperature of the treated sample was attempted using MDSC (a calorimeter with a differential scanning operation of a temperature cycle mode; manufactured by TA INSTRUMENTS Co., Ltd.; 2910MDSC) under the condition of a rate of temperature elevation of 2° C./minute, an amplitude of temperature of ±2° C. and a flow speed of the nitrogen gas of 30 ml/minute. No transition points were observed up to the temperature of 420° C. The heat decomposition temperature was measured in accordance with the same method as that used for a film. The results are shown in Table 1.

TABLE 1

| | Glass transition temperature (° C.) | Heat decomposition temperature (° C.) | solubility | dielectric constant |
|---|---|---|---|---|
| Example 1 | >450 | 523 | good | 2.86 |
| Example 2 | >450 | 524 | good | 2.89 |
| Example 3 | >450 | 518 | good | 2.84 |
| Example 4 | >450 | 529 | good | 2.80 |
| Example 5 | 452 | 523 | good | 2.88 |
| Example 6 | 448 | 525 | good | 2.85 |
| Example 7 | 440 | 522 | good | 2.85 |
| Example 8 | 390 | 535 | good | 2.90 |
| Example 9 | >440 | 545 | good | 2.80 |
| Example 10 | >400 | 565 | good | 2.80 |
| Example 11 | >450 | 550 | good | 2.88 |
| Example 12 | >450 | 545 | good | 2.86 |
| Example 13 | 456 | 547 | good | 2.82 |
| Example 14 | 447 | 568 | good | 2.86 |
| Example 15 | 415 | 523 | good | 2.85 |
| Comparative Example 1 | (>420) | (527) | poor | na |
| Comparative Example 2 | 387 | 515 | good | 2.80 |

TABLE 1-continued

| | Glass transition temperature (° C.) | Heat decomposition temperature (° C.) | solubility | dielectric constant |
|---|---|---|---|---|
| Comparative Example 3 | 370 | 515 | good | 2.90 |
| Comparative Example 4 | 380 | 520 | good | 3.00 |
| Comparative Example 5 | 375 | 515 | good | 2.80 |
| Comparative Example 6 | 365 | 514 | good | 3.00 |
| Comparative Example 7 | (>420) | (540) | poor | na |

Note
na: Data are not available since the measurement was not possible.

As clearly shown by the results in Table 1, the precursors of a polybenzoxazole resin obtained in Comparative Examples 1 and 7 had poor solubility in N-methyl-2-pyrrolidone and no films could be prepared. The precursors of a polybenzoxazole resin obtained in Comparative Examples 2 to 6 were soluble in N-methyl-2-pyrrolidone and films could be prepared. However, the resins had insufficient heat resistance since the glass transition temperature was low and the heat decomposition temperature was relatively low. In contrast, the precursors of a polybenzoxazole resin of the present invention which were obtained in Examples were soluble in N-methyl-2-pyrrolidone and films could be prepared. The resins showed very excellent heat resistance and the object of the present invention could be sufficiently achieved.

What is claimed is:
1. A precursor of a polybenzoxazole resin which comprises a crosslinking group in a molecule.
2. A precursor of a polybenzoxazole resin according to claim 1, which comprises a structure represented by general formula [1]:

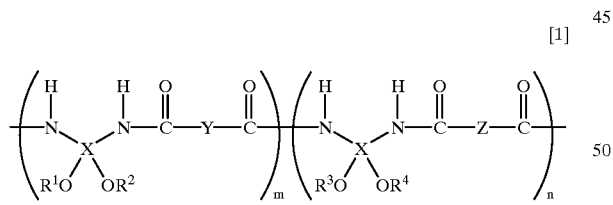

[1]

wherein $R^1$ to $R^4$ each independently represent hydrogen atom or a monovalent organic group, X represents a tetravalent group selected from groups represented by following formulae (A), two groups represented by X may be the same with or different from each other, Y represents at least one divalent group selected from groups represented by following formulae (B), (C), (D) and (E), Z represents a divalent group selected from groups represented by following formulae (F), m and n each represent an integer satisfying relations of $m>0$, $n\geq 0$, $2\leq m+n\leq 1,000$ and $0.05\leq m/(m+n) \leq 1$ and arrangement of repeating units may be a block arrangement or a random arrangement;

Formulae (A)

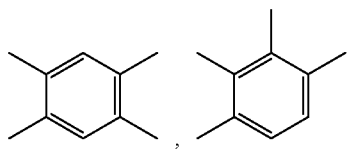

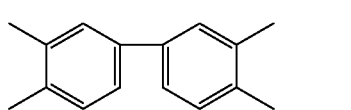

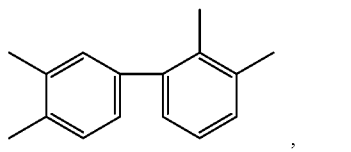

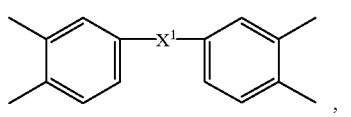

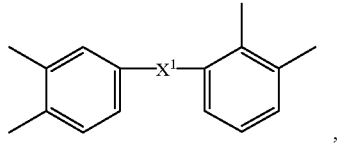

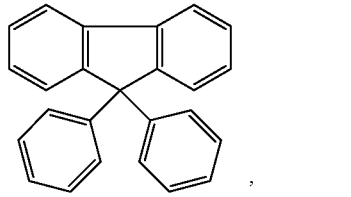

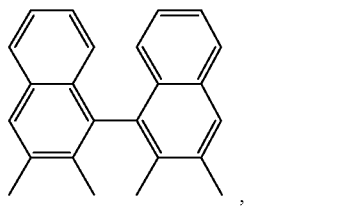

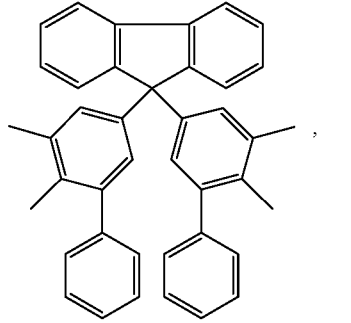

Formulae (B)-1
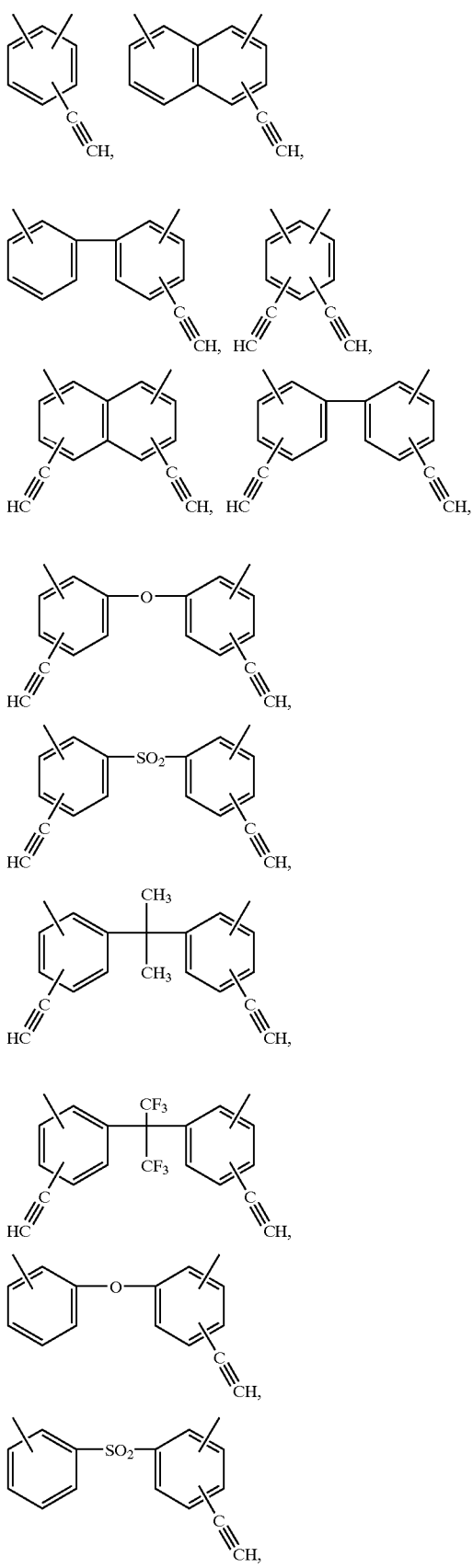
Formulae (B)-2
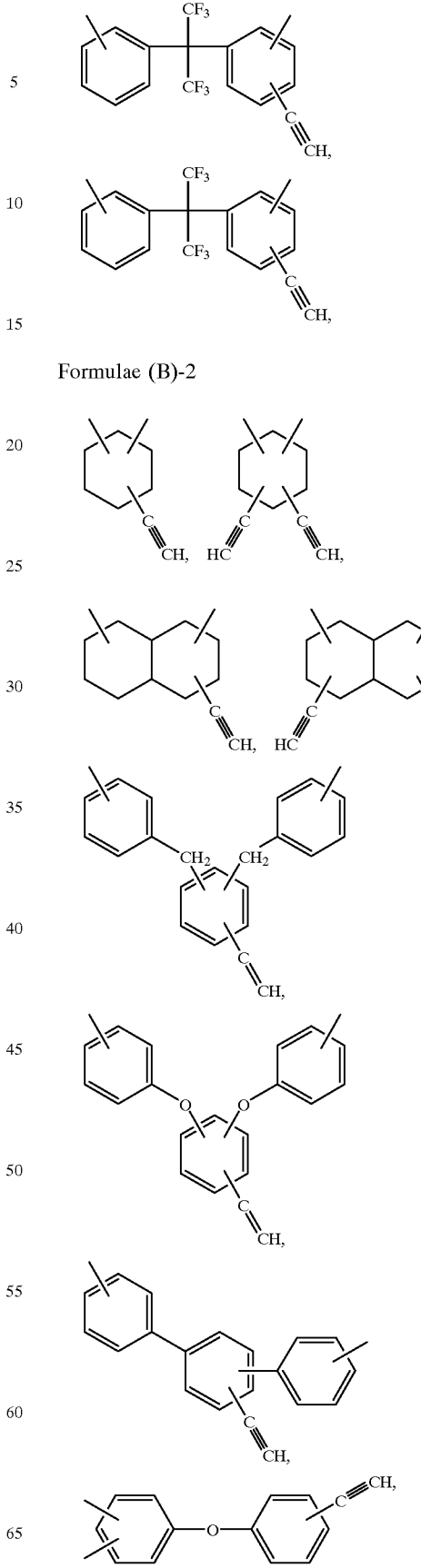

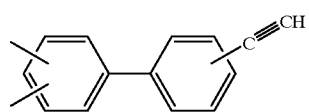
Formulae (C)-1
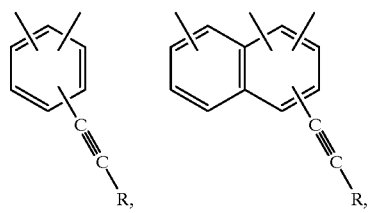
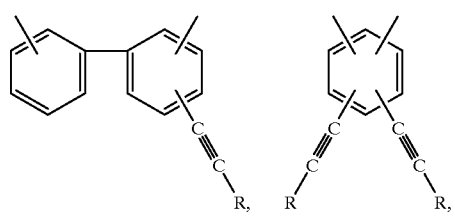
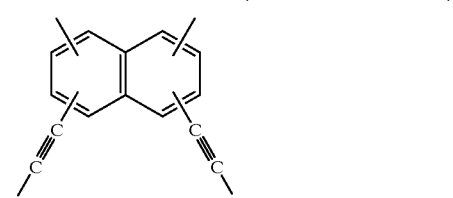
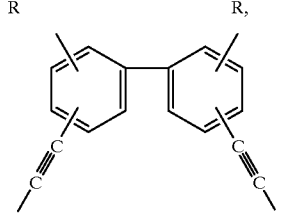
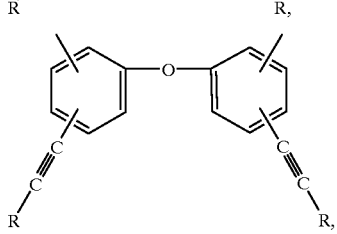
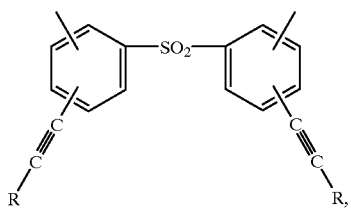
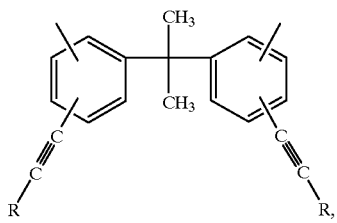
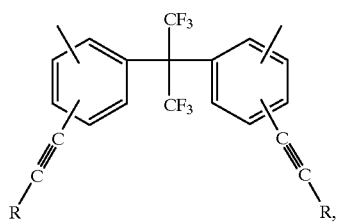
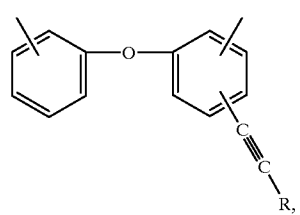
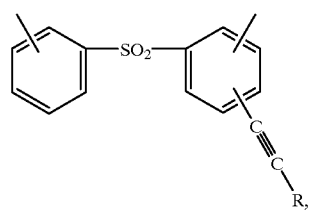
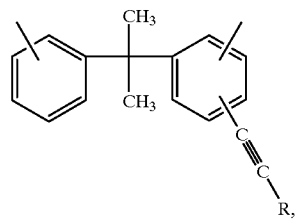
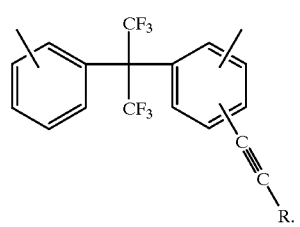
Formulae (C)-2
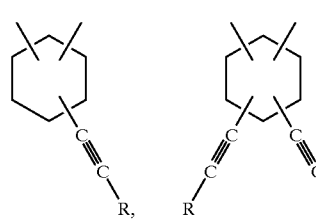
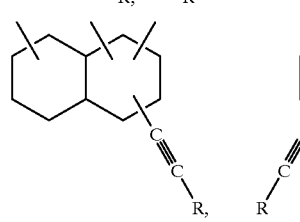

-continued
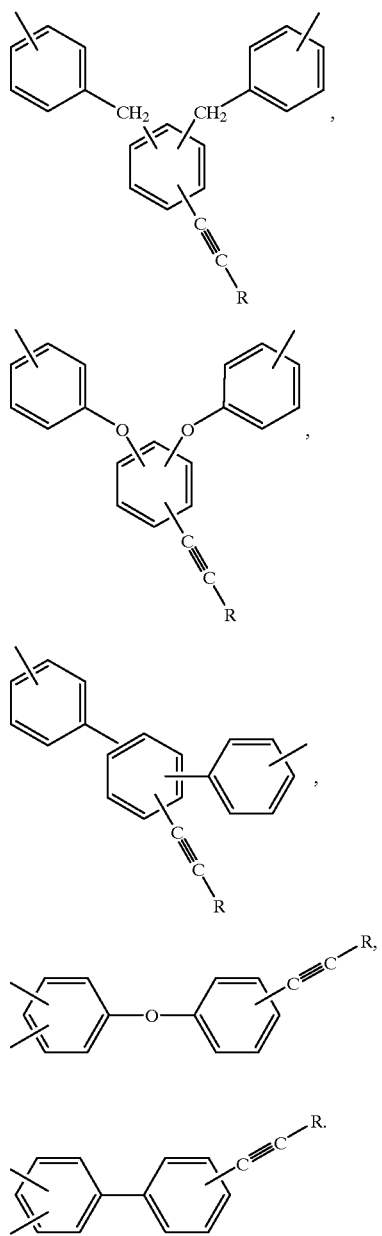
Formulae (D)
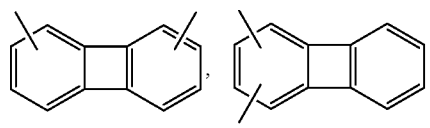
Formula (E)
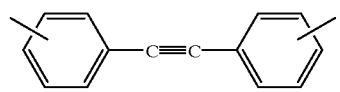
Formulae (F)
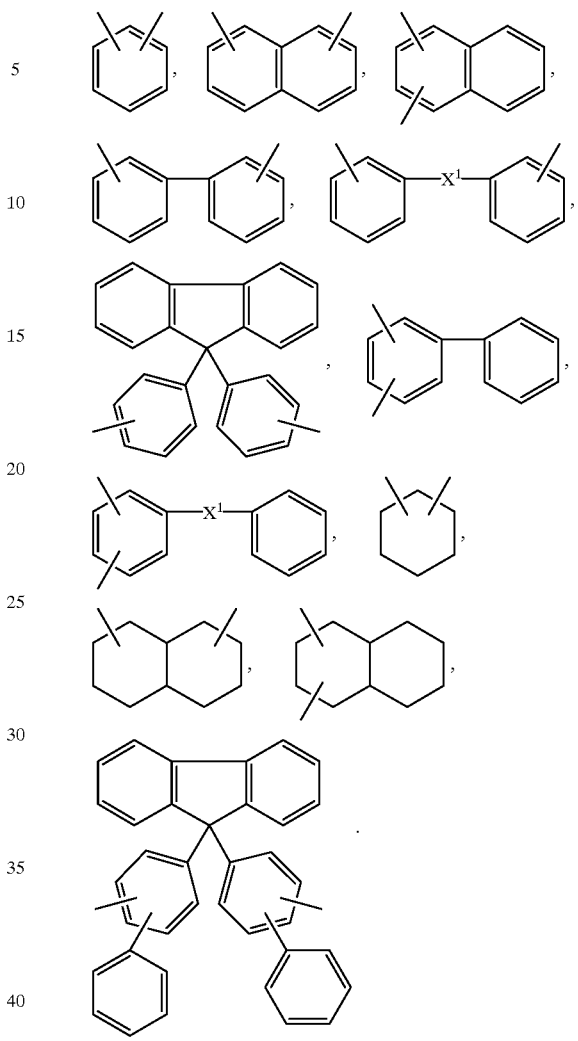
wherein $X^1$ in formulae (A) and (F) represents a divalent group selected from groups represented by following formulae (G):
Formula (G)
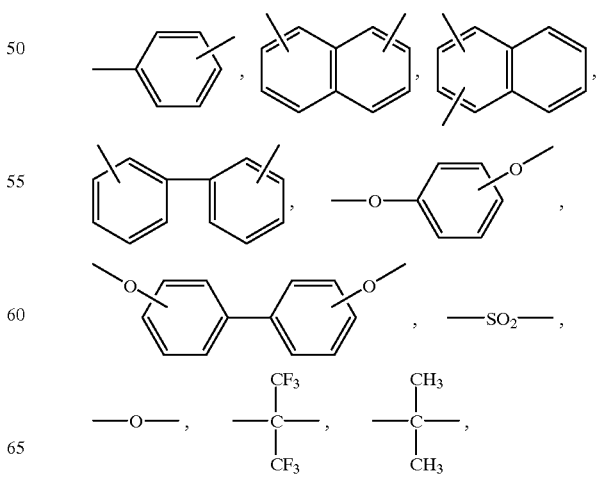

-continued

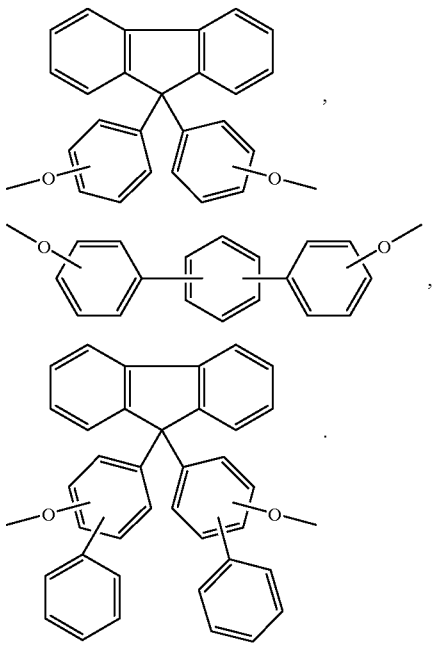

R in formulae (C) represents an alkyl group or a monovalent group selected from groups represented by formulae (H):

Formulae (H)

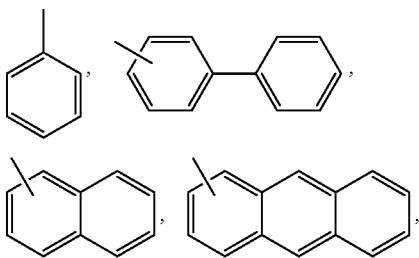

-continued

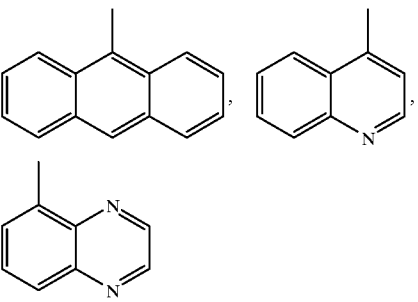

and hydrogen atoms on a benzene ring in groups represented by Formulae (A), (B), (C), (D), (E), (F) and (G) may be substituted with at least one atom or group selected from alkyl groups having 1 to 4 carbon atom, fluorine atom and trifluoromethyl group.

3. A polybenzoxazole resin which is obtained from a precursor of a polybenzoxazole resin described in claim 1 by a condensation reaction and a crosslinking reaction.

4. A polybenzoxazole resin which is obtained from a precursor of a polybenzoxazole resin described in claim 2 by a condensation reaction and a crosslinking reaction.

5. An insulating film which comprises a polybenzoxazole resin described in claim 3.

6. An insulating film which comprises a polybenzoxazole resin described in claim 4.

7. A semiconductor device which comprises at least one film which is selected from insulating interlayer films in multi-layer wiring and films for protecting surfaces and comprises an insulating film described in claim 5.

8. A semiconductor device which comprises at least one film which is selected from insulating interlayer films in multi-layer wiring and films for protecting surfaces and comprises an insulating film described in claim 6.

* * * * *